(12) United States Patent
Park et al.

(10) Patent No.: US 12,075,681 B2
(45) Date of Patent: Aug. 27, 2024

(54) TRANSPARENT DISPLAY DEVICE WITH TOUCH SENSOR

(71) Applicant: LG Display Co., Ltd., Seoul (KR)

(72) Inventors: JaeHee Park, Paju-si (KR); Kihyung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 29 days.

(21) Appl. No.: 17/977,911

(22) Filed: Oct. 31, 2022

(65) Prior Publication Data

US 2023/0200181 A1 Jun. 22, 2023

(30) Foreign Application Priority Data

Dec. 20, 2021 (KR) ........................ 10-2021-0182767

(51) Int. Cl.
| | |
|---|---|
| H01L 27/32 | (2006.01) |
| G06F 3/041 | (2006.01) |
| G06F 3/044 | (2006.01) |
| H01L 27/12 | (2006.01) |
| H10K 59/121 | (2023.01) |
| H10K 59/131 | (2023.01) |
| H10K 59/40 | (2023.01) |

(52) U.S. Cl.
CPC ........... *H10K 59/40* (2023.02); *G06F 3/0418* (2013.01); *G06F 3/0446* (2019.05); *H01L 27/124* (2013.01); *H10K 59/1213* (2023.02); *H10K 59/131* (2023.02); *G06F 2203/04111* (2013.01)

(58) Field of Classification Search
CPC ...... G06F 3/0466; G06F 3/0412; G06F 3/041; G06F 3/0443; G06F 3/044; G06F 3/04164; G06F 3/0488; G06F 3/0416; G06F 3/04883; G06F 2203/04112; G06F 2203/04102; G06F 1/1643; G06F 1/1626
See application file for complete search history.

(56) References Cited

U.S. PATENT DOCUMENTS

| | | | |
|---|---|---|---|
| 11,386,821 B2 | 7/2022 | Lee | |
| 2010/0283759 A1* | 11/2010 | Iso | ........................ G06F 3/0416 |
| | | | 345/174 |
| 2012/0062511 A1* | 3/2012 | Ishizaki | ................ G06F 3/0445 |
| | | | 345/87 |

(Continued)

FOREIGN PATENT DOCUMENTS

KR 20210086283 A 7/2021

*Primary Examiner* — Dong Hui Liang
(74) *Attorney, Agent, or Firm* — Seed IP Law Group LLP

(57) ABSTRACT

A transparent display device with a touch sensor is provided, which may reduce loss of light transmittance due to a touch sensor and a touch line and may detect a defective touch sensor in a touch block. The device includes transmissive areas and a non-transmissive area disposed between the transmissive areas adjacent to each other, a plurality of touch lines provided in the non-transmissive area, and a plurality of touch blocks respectively connected to the plurality of touch lines. Each touch block includes a plurality of touch sensors disposed in the transmissive areas and comprised of M number of rows and N number of columns, a plurality of sensing lines disposed to correspond to the N number of columns, and a plurality of sensing transistors respectively connected to the plurality of touch sensors, transferring a voltage of the connected touch sensor to one of the plurality of sensing lines.

19 Claims, 18 Drawing Sheets

(56) References Cited

U.S. PATENT DOCUMENTS

| | | | |
|---|---|---|---|
| 2013/0141343 A1* | 6/2013 | Yu | G06F 3/0443 |
| | | | 345/173 |
| 2016/0132154 A1* | 5/2016 | Lee | G06F 3/0443 |
| | | | 345/174 |
| 2017/0213873 A1* | 7/2017 | Bok | H10K 59/1213 |
| 2018/0166518 A1* | 6/2018 | Kim | H10K 59/131 |
| 2019/0227652 A1* | 7/2019 | Kwon | G06F 3/04166 |
| 2020/0251542 A1* | 8/2020 | Fu | H10K 59/122 |

* cited by examiner

TRANSPARENT DISPLAY DEVICE WITH TOUCH SENSOR

BACKGROUND

Technical Field

The present disclosure relates to a transparent display device with a touch sensor.

Description of the Related Art

Recently, studies for a transparent display device in which a user may view objects or images positioned at an opposite side through the display device are actively ongoing. The transparent display device includes a display area on which an image is displayed, wherein the display area may include a transmissive area capable of transmitting external light and a non-transmissive area, and may have high light transmittance through the transmissive area.

A transparent display device may be provided with a plurality of touch sensors and a plurality of touch lines to implement a touch function.

BRIEF SUMMARY

The transparent display device, however, may have problems in that it is not easy to form the plurality of touch sensors and the plurality of touch lines or a process is complicated and light transmittance may be reduced due to the plurality of touch sensors and the plurality of touch lines. One or more embodiments of the present disclosure address the various technical problems in the related art and the problems identified above.

One or more embodiments of the present disclosure provide a transparent display device that may reduce or minimize loss of light transmittance due to a touch sensor and a touch line.

One or more embodiments of the present disclosure provide a transparent display device that may detect a defective touch sensor among a plurality of touch sensors provided in a touch block.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a transparent display device with a touch sensor, the transparent display device comprising a plurality of transmissive areas and a non-transmissive area disposed between the transmissive areas adjacent to each other, a plurality of touch lines provided in the non-transmissive area, and a plurality of touch blocks respectively connected to the plurality of touch lines. Each of the plurality of touch blocks includes a plurality of touch sensors disposed in the plurality of transmissive areas and comprised of M number of rows and N number of columns, a plurality of sensing lines disposed to correspond to the N number of columns, and a plurality of sensing transistors respectively connected to the plurality of touch sensors, transferring a voltage of the connected touch sensor to one of the plurality of sensing lines.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
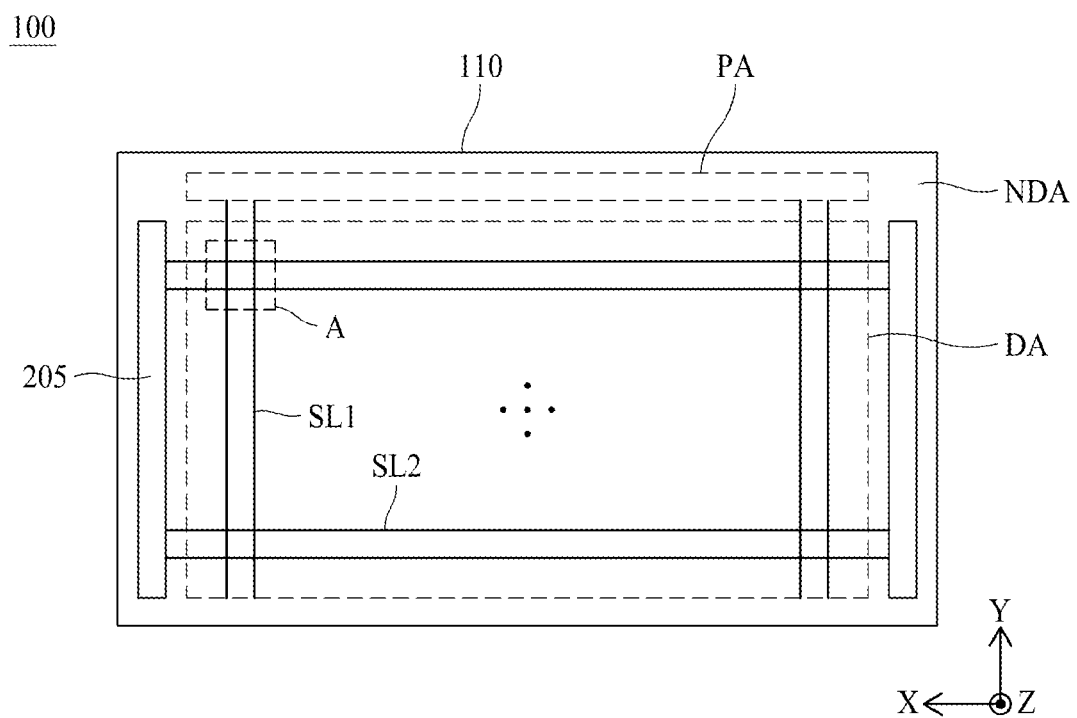
FIG. 1 is a schematic plan view illustrating a transparent display panel.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a dimension (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a schematic plan view illustrating a transparent display panel.

Hereinafter, for example, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device etc.

Referring to FIG. 1, a transparent display device according to one embodiment of the present disclosure includes a transparent display panel 110. The transparent display panel 110 may include a display area DA provided with pixels to display an image, and a non-display area NDA for not displaying an image.

The display area DA may be provided with a first signal lines SL1, a second signal lines SL2 and the pixels. The non-display area NDA may be provided with a pad area PA in which pads are disposed, and at least one scan driver 205.

The first signal lines SL1 may be extended in the display area DA in a first direction (e.g., Y-axis direction). The first signal lines SL1 may cross the second signal lines SL2 in the display area DA. The second signal lines SL2 may be extended in the display area DA in a second direction (e.g., X-axis direction). The pixel may be provided in an area where the first signal line SL1 and the second signal line SL2 cross each other, and emits predetermined light to display an image.

The scan driver 205 are connected to the scan lines and supplies scan signals to the scan lines. The scan driver 205 may be disposed in the non-display area NDA on one side or both sides of the display area DA of the transparent display panel 110 by a gate driver in panel (GIP) method or a tape automated bonding (TAB) method.

The transparent display panel 110 may further include a touch line and a touch sensor in addition to the first signal line SL1, the second signal line SL2 and the pixel in order to implement a touch function. A detailed description of the touch line and the touch sensor will be described later with reference to FIGS. 2 to 18B.

Figure 2:
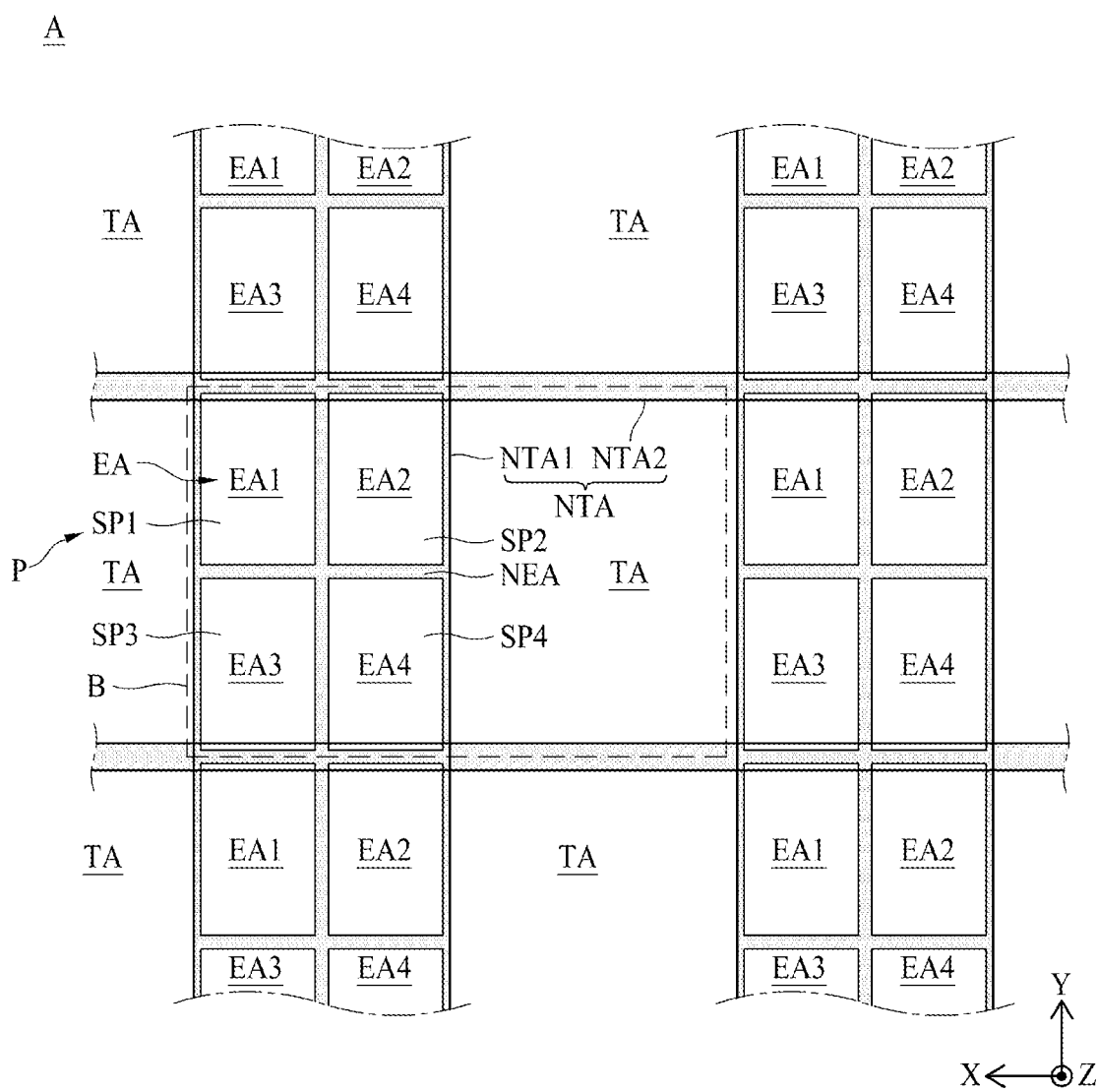
FIG. 2 is a schematic view illustrating an example of a pixel provided in an area A of FIG. 1.
Figure 3:
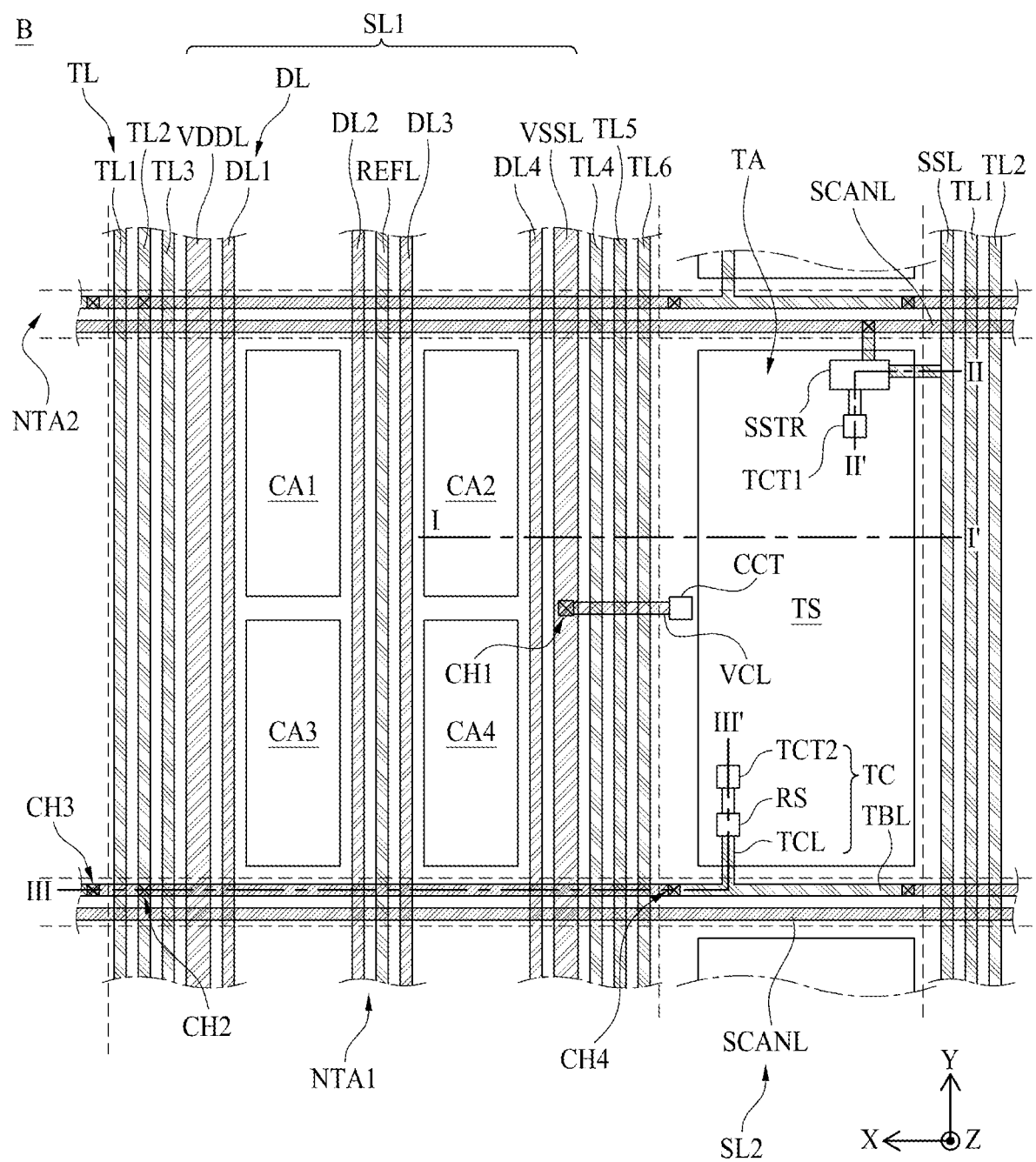
FIG. 3 is a view illustrating an example of signal lines, touch lines and a touch sensor, which are provided in an area B of FIG. 2.

FIG. 2 is a schematic view illustrating an example of a pixel provided in an area A of FIG. 1 and FIG. 3 is a view illustrating an example of signal lines, touch lines and a touch sensor, which are provided in an area B of FIG. 2.

The display area DA, as shown in FIG. 2, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α %, for example, about 90%, and the non-transmissive area NTA may be an area where light transmittance is smaller than (3%, for example, about 50%. At this time, a is greater than β. A user may view an object or background arranged over a rear surface of the transparent display panel 110 due to the transmissive area TA.

The non-transmissive area NTA may include a first non-transmissive area NTA1, a second non-transmissive area NTA2 and a plurality of pixels P. Pixels P may be provided in the first non-transmissive area NTA1 or in an overlapping area where the first non-transmissive area NTA1 and a second non-transmissive area NTA2 overlap, and emit predetermined light to display an image. A light emission area EA may correspond to an area, from which light is emitted, in the pixel P.

Each of the pixels P, as shown in FIG. 2, may include at least one of a first subpixel SP1, a second subpixel SP2, a third subpixel SP3 and a fourth subpixel SP4. The first subpixel SP1 may include a first light emission area EA1 emitting light of a first color. The second subpixel SP2 may include a second light emission area EA2 emitting light of a second color. The third subpixel SP3 may include a third light emission area EA3 emitting light of a third color. The fourth subpixel SP4 may include a fourth light emission area EA4 emitting light of a fourth color.

The first to fourth light emission area EA1, EA2, EA3 and EA4 may emit light of different colors. For example, the first light emission area EA1 may emit light of a green color. The second light emission area EA2 may emit light of a red color. The third light emission area EA3 may emit light of a blue color. The fourth light emission area EA4 may emit light of a white color. However, the light emission areas are not limited to this example. Each of the pixels P may further include a subpixel emitting light of a color other than red, green, blue and white. Also, the arrangement order of the subpixels SP1, SP2, SP3 and SP4 may be changed in various ways.

The first non-transmissive area NTA1 may be extended in a first direction (e.g., Y-axis direction) in a display area DA, and may be disposed to at least partially overlap light emission areas EA1, EA2, EA3 and EA4. A plurality of first non-transmissive areas NTA1 may be provided in the transparent display panel 110, and a transmissive area TA may be provided between two adjacent first non-transmissive areas NTA1. In the first non-transmissive area NTA1, first signals lines extended in the first direction (e.g., Y-axis direction), touch lines TL extended in the first direction (e.g., Y-axis direction) and a sensing line SSL extended in the first direction (e.g., Y-axis direction) may be disposed to be spaced apart from each other.

For example, the first signal lines SL1 may include at least one of a pixel power line VDDL, a common power line VSSL, a reference line REFL or data lines DL1, DL2, DL3 and DL4.

The pixel power line VDDL may supply a first power source to a driving transistor DTR of each of subpixels SP1, SP2, SP3 and SP4 provided in the display area DA. The first power source may be an anode power source.

The common power line VSSL may supply a second power source to a cathode electrode of the subpixels SP1, SP2, SP3 and SP4 provided in the display area DA. At this time, the second power source may be a cathode power source. The cathode power source may be a common power source commonly supplied to the subpixels SP1, SP2, SP3 and SP4.

The common power line VSSL may supply the cathode power source to the cathode electrode through a cathode contact electrode CCT provided between the transmissive area TA and the common power line VSSL. A power connection line VCL may be disposed between the common power line VSSL and the cathode contact electrode CCT. One end of the power connection line VCL may be connected to the common power line VSSL through a first contact hole CH1 and the other end thereof may be connected to the cathode contact electrode CCT. The cathode electrode may be connected to the cathode contact electrode CCT. As a result, the cathode electrode may be electrically connected to the common power line VSSL through the power connection line VCL and the cathode contact electrode CCT.

The reference line REFL may supply an initialization voltage (or reference voltage) to the driving transistor DTR of each of the subpixels SP1, SP2, SP3 and SP4 provided in the display area DA. The reference line REFL may be disposed between the plurality of data lines DL1, DL2, DL3 and DL4. For example, the reference line REFL may be disposed at the center of the plurality of data lines DL1, DL2, DL3 and DL4, that is, between the second data line DL2 and the third data line DL3.

The reference line REFL may be diverged and connected to the plurality of subpixels SP1, SP2, SP3 and SP4. In detail, the reference line REFL may be connected to circuit elements of the plurality of subpixels SP1, SP2, SP3 and SP4 to supply an initialization voltage (or reference voltage) to each of the subpixels SP1, SP2, SP3 and SP4.

Each of the data lines DL1, DL2, DL3 and DL4 may supply a data voltage to the subpixels SP1, SP2, SP3 and SP4. For example, the first data line DL1 may supply a first data voltage to a first driving transistor of the first subpixel SP1, the second data line DL2 may supply a second data voltage to a second driving transistor of the second subpixel SP2, the third data line DL3 may supply a third data voltage to a third driving transistor of the third subpixel SP3 and the fourth data line DL4 may supply a fourth data voltage to a fourth driving transistor of the fourth subpixel SP4.

In the transparent display panel 110 according to one embodiment of the present disclosure, the touch line TL may be further disposed in the first non-transmissive area NTA1. At least two touch lines TL may be provided in the first non-transmissive area NTA1. When the plurality of touch lines TL are disposed in the transmissive area TA of the transparent display panel 110, light transmittance may be deteriorated due to the plurality of touch lines TL.

Also, a slit, specifically an elongated linear or rectangular shape, may be provided between the plurality of touch lines TL. When external light passes through the slit, a diffraction phenomenon may occur. According to the diffraction phenomenon, light corresponding to plane waves may be changed to spherical waves as the light passes through the slit, and an interference phenomenon may occur in the spherical waves. Therefore, constructive interference and destructive interference occur in the spherical waves, whereby the external light that has passed through the slit may have irregular light intensity. As a result, in the transparent display panel 110, definition of an object or image positioned at an opposite side may be reduced. For this reason, in one embodiment, the plurality of touch lines TL are preferably disposed in the first non-transmissive area NTA1 rather than the transmissive area TA.

A plurality of touch lines TL may be disposed between first signal lines SL1 in the first non-transmissive area NTA1 and a transmissive area TA as shown in FIG. 3. For example, six touch lines TL1, TL2, TL3, TL4, TL5 and TL6 may be disposed in one first non-transmissive area NTA1. Three TL1, TL2 and TL3 of the six touch lines TL1, TL2, TL3, TL4, TL5 and TL6 may be disposed between a pixel power line VDDL and the transmissive area TA, and the other three touch lines TL4, TL5 and TL6 may be disposed between a common power line VSSL and the transmissive area TA, but are not limited to this arrangement. In one embodiment, it is beneficial to have the plurality of touch lines TL so as not to overlap circuit areas CA1, CA2, CA3 and CA4 in which circuit elements are disposed, and various modifications may be made in the arrangement order of the plurality of touch lines TL with the first signal lines SL1.

In the transparent display panel 110 according to one embodiment of the present disclosure, a sensing line SSL may be further disposed in the first non-transmissive area NTA1. The sensing line SSL is to detect whether short-circuit occurs between a cathode electrode of a light emitting element and a touch sensor electrode of a touch sensor TS, and may sense a voltage applied to the touch sensor electrode of a plurality of touch sensors TS through a sensing transistor SSTR.

The sensing line SSL may be disposed to be adjacent to the transmissive area TA in the first non-transmissive area NTA1. In detail, the sensing line SSL may be disposed between the plurality of touch lines TL and the transmissive area TA. The plurality of touch lines TL may be provided between the pixel power line VDDL and the transmissive area TA or between the common power line VSSL and the transmissive area TA. The plurality of touch lines TL may generate parasitic capacitance with the pixel power line VDDL or the common power line VSSL. The plurality of touch lines TL may have parasitic capacitance that is reduced as a spaced distance from the pixel power line VDDL or the common power line VSSL is increased, and may have parasitic capacitance that is increased as the spaced distance from the pixel power line VDDL or the common power line VSSL is reduced. For example, the parasitic capacitance of the first touch line TL1 may be smaller than that of the third touch line TL3. As a result, a deviation of parasitic capacitance between the plurality of touch lines TL may be increased, and touch performance may be reduced.

In the transparent display panel 110 according to one embodiment of the present disclosure, the sensing line SSL may be disposed between the plurality of touch lines TL and the transmissive area TA, whereby the deviation of parasitic capacitance between the plurality of touch lines TL may be reduced. The touch line TL, e.g., the first touch line TL1, which has the greatest spaced distance from the pixel power line VDDL or the common power line VSSL may have the smallest spaced distance from the sensing line SSL. Therefore, in the case of the first touch line TL1, the parasitic capacitance between the first touch line TL1 and the pixel power line VDDL or the common power line VSSL is the smallest, but the parasitic capacitance between the first touch line TL1 and the sensing line SSL may be the greatest. On the other hand, the touch line TL, e.g., the third touch line TL3, which has the smallest spaced distance from the pixel power line VDDL or the common power line VSSL may have the greatest spaced distance from the sensing line SSL. Therefore, in the case of the third touch line TL3, the parasitic capacitance between the third touch line TL3 and the pixel power line VDDL or the common power line VSSL may be the greatest, but the parasitic capacitance between the third touch line TL3 and the sensing line SSL may be smallest. As a result, the deviation of parasitic capacitance between the plurality of touch lines TL may be reduced. Although FIG. 3 illustrates that a separate sensing line SSL is provided in the transparent display panel 110, but the present disclosure is not limited thereto. In another embodiment, at least one of the pixel power line VDDL, the common power line VSSL, the reference line REFL and the data lines DL1, DL2, DL3 and DL4 may serve as the sensing line SSL.

The transparent display panel 110 according to one embodiment of the present disclosure includes a pixel P between adjacent transmissive areas TA, and the pixel P may include light emission areas EA1, EA2, EA3 and EA4 in which a light emitting element is disposed to emit light. Since a size of the non-transmissive area NTA is small in the transparent display panel 110, the circuit element may be disposed to at least partially overlap the light emission areas EA1, EA2, EA3 and EA4.

In a transparent display panel 110 according to one embodiment of the present disclosure, a plurality of touch lines TL do not overlap circuit areas CA1, CA2, CA3 and CA4, so that parasitic capacitance of the touch lines TL due to a circuit element may be reduced or minimized. At the same time the horizontal distance difference between the touch lines TL may be reduced to improve uniformity of parasitic capacitance.

The second non-transmissive area NTA2 may be extended in the display area DA in a second direction (e.g., X-axis direction), and may be disposed to at least partially overlap the light emission areas EA1, EA2, EA3 and EA4. A plurality of second non-transmissive areas NTA2 may be provided in the transparent display panel 110, and the transmissive area TA may be provided between two adjacent second non-transmissive areas NTA2. The second signal line SL2 and a touch bridge line TBL may be disposed to be spaced apart from each other in the second non-transmissive area NTA2.

A second signal line SL2 may be extended in a second direction (e.g. X-axis direction), and may include, for example, a scan line SCANL. The scan line SCANL may supply a scan signal to the subpixels SP1, SP2, SP3 and SP4 of the pixel P.

A touch bridge line TBL may connect any one of the plurality of touch lines TL with a touch sensor TS. The touch bridge line TBL may be connected to any one of the plurality of touch lines TL through a second contact hole CH2. Also, the touch bridge line TBL may be connected to at least two touch sensors TS arranged in a second direction (e.g., X-axis direction) while being extended in the second direction (e.g., X-axis direction).

In the transparent display panel 110 according to one embodiment of the present disclosure, the plurality of touch lines TL may be disposed in a first non-transmissive area NTA1 not a second non-transmissive area NTA2, so that light transmittance may be prevented from being deteriorated due to the plurality of touch lines TL. The second non-transmissive area NTA2 extended in the second direction (e.g., X-axis direction) crosses between adjacent transmissive areas TA as shown in FIG. 3. When a width of the second non-transmissive area NTA2 crossing the transmissive areas TA is increased, a size of the transmissive area TA is necessarily reduced. When the plurality of touch lines TL are disposed in the second non-transmissive area NTA2, the width of the second non-transmissive area NTA2 is increased to dispose a large number of lines, and the size of the transmissive area TA is reduced. That is, a problem may occur in that light transmittance of the transparent display panel 110 is reduced due to the plurality of touch lines TL.

In the transparent display panel 110 according to one embodiment of the present disclosure, the plurality of touch lines TL may be disposed in the first non-transmissive area NTA1, and only one touch bridge line TBL for connecting the plurality of touch sensors TS may be provided in the second non-transmissive area NTA2. Therefore, the transparent display panel 110 according to one embodiment of the present disclosure may reduce or minimize the size decrease of the transmissive area TA or decrease in light transmittance due to the plurality of touch lines TL and the touch bridge line TBL.

The touch sensor TS may be provided in the transmissive area TA. The touch sensor TS may be disposed in each of the plurality of transmissive areas TA, and may be changed in capacitance during user contact. A touch driver (not shown) may be connected to the plurality of touch sensors TS through the plurality of touch lines TL to detect a change in capacitance of the plurality of touch sensors TS. The plurality of touch sensors TS may correspond to the plurality of pixels P one-to-one.

Hereinafter, a connection relation among a plurality of touch sensors TS, a plurality of touch lines TL and a plurality of touch bridge lines TBL will be described in more detail with reference to FIGS. 4 and 5.

Figure 4:
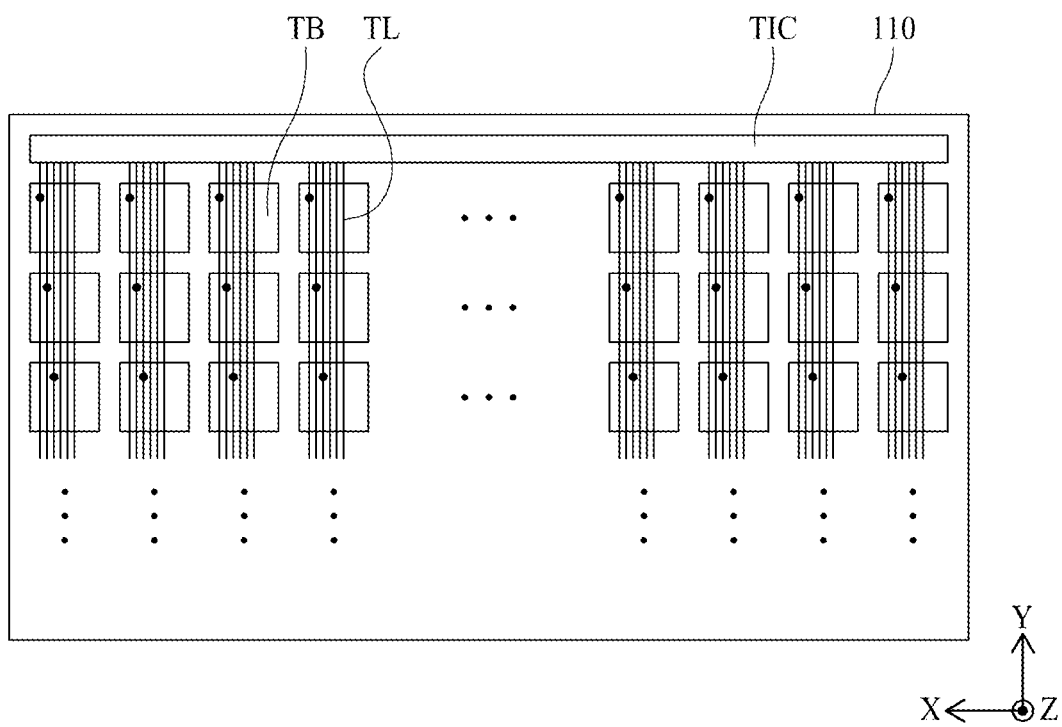
FIG. 4 is a view illustrating a connection relation between a plurality of touch blocks and a plurality of touch lines.
Figure 5:
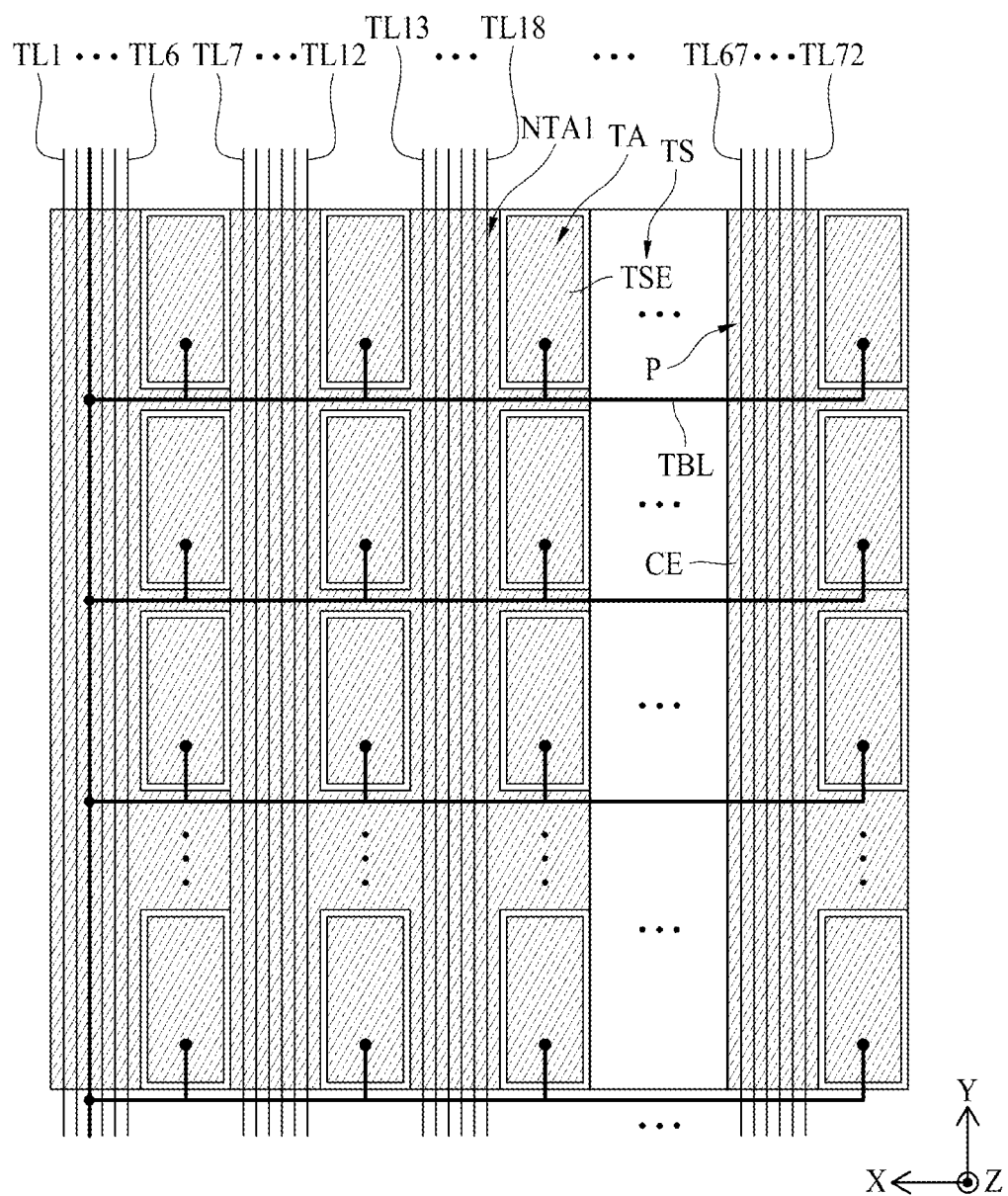
FIG. 5 is a view illustrating a connection relation between a plurality of touch lines and a plurality of touch sensors in one touch block.

FIG. 4 is a view illustrating a connection relation between a plurality of touch blocks and a plurality of touch lines, and FIG. 5 is a view illustrating a connection relation between a plurality of touch lines and a plurality of touch sensors in one touch block.

Referring to FIGS. 4 to 5, the transparent display panel 110 according to one embodiment of the present disclosure may include a plurality of touch blocks TB. Each of the plurality of touch blocks TB may include a plurality of pixels P and a plurality of transmissive areas TA disposed to correspond to the plurality of pixels P one-to-one as a basic unit for determining a user touch position. For example, each of the plurality of touch blocks TB may include 12×15 pixels P and 12×15 touch sensors TS. In this case, when image resolution is 1920×1080, touch resolution may be 160×72.

At this time, the touch sensor TS may include a touch sensor electrode TSE. The touch sensor electrode TSE may include the same material in the same layer as the cathode electrode CE of the pixel P. In this case, the touch sensor electrode TSE and the cathode electrode CE may be disposed to be spaced apart from each other.

In the transparent display panel 110 according to one embodiment of the present disclosure, as each of the plurality of touch lines TL is connected to one of the plurality of touch blocks TB, a change in capacitance of the touch sensors TS provided in the connected touch block TB may be sensed. That is, the plurality of touch lines TL provided in the transparent display panel 110 may correspond to the plurality of touch blocks TB one-to-one. Therefore, the number of touch lines TL may be the same as the number of touch blocks TB in the transparent display panel 110. For example, when the number of touch blocks TB is 160×72, the touch line TL may also be 160×72, and may be connected to the touch driver TIC.

As described above, in order to form the touch lines TL as much as the number of touch blocks TB, at least two touch lines TL should be provided in one first non-transmissive area NTA1. For example, when image resolution is 1920×1080 and touch resolution is 160×72, six touch lines TL1, TL2, TL3, TL4, TL5 and TL6 may be provided in one first non-transmissive area NTA1, as shown in FIG. 3, in order to form 160×72 touch lines TL in the transparent display panel 110.

The plurality of touch sensors TS provided in one touch block TB may be connected to one of the plurality of touch lines TL provided in one touch block TB as shown in FIG. 5. For example, twelve first non-transmissive areas NTA1 may be provided in one touch block TB, and six touch lines TL1, TL2, TL3, TL4, TL5 and TL6 may be disposed in each of the twelve first non-transmissive areas NTA1. As a result, one touch block TB may be provided with 72 touch lines TL1, TL72. In this case, the plurality of touch sensors TS provided in one touch block TB may be connected to one specific touch line TL of the 72 touch lines TL1, TL72. At this time, the specific touch line TL may be connected to the plurality of touch sensors TS arranged in the second direction (e.g., X-axis direction) through the touch bridge lines TBL extended in the second direction (e.g., X-axis direction). As a result, the plurality of touch sensors TS provided in one touch block TB may be electrically connected through a specific touch line TL and the touch bridge lines TBL.

Each of the plurality of touch lines TL may correspond to touch blocks TB one-to-one. Therefore, the plurality of touch blocks TB are connected to different touch lines and thus may be electrically separated from each other. Each touch line TL may connect a plurality of touch sensors TS provided in a corresponding touch block TB to a touch driver TIC. In detail, each touch line TL may transmit the changed capacitance provided from the touch sensors TS provided in the touch block TB to the touch driver TIC. The touch driver TIC may sense the changed capacitance, and may determine a touch position of a user. Also, each touch line TL may provide the sensing voltage generated from the touch driver TIC to the touch sensors TS provided in the touch block TB.

Hereinafter, light emitting elements of a light emission area EA and the touch sensors TS of the transmissive area TA will be described in more detail with reference to FIGS. 6 to 7.

Figure 6:
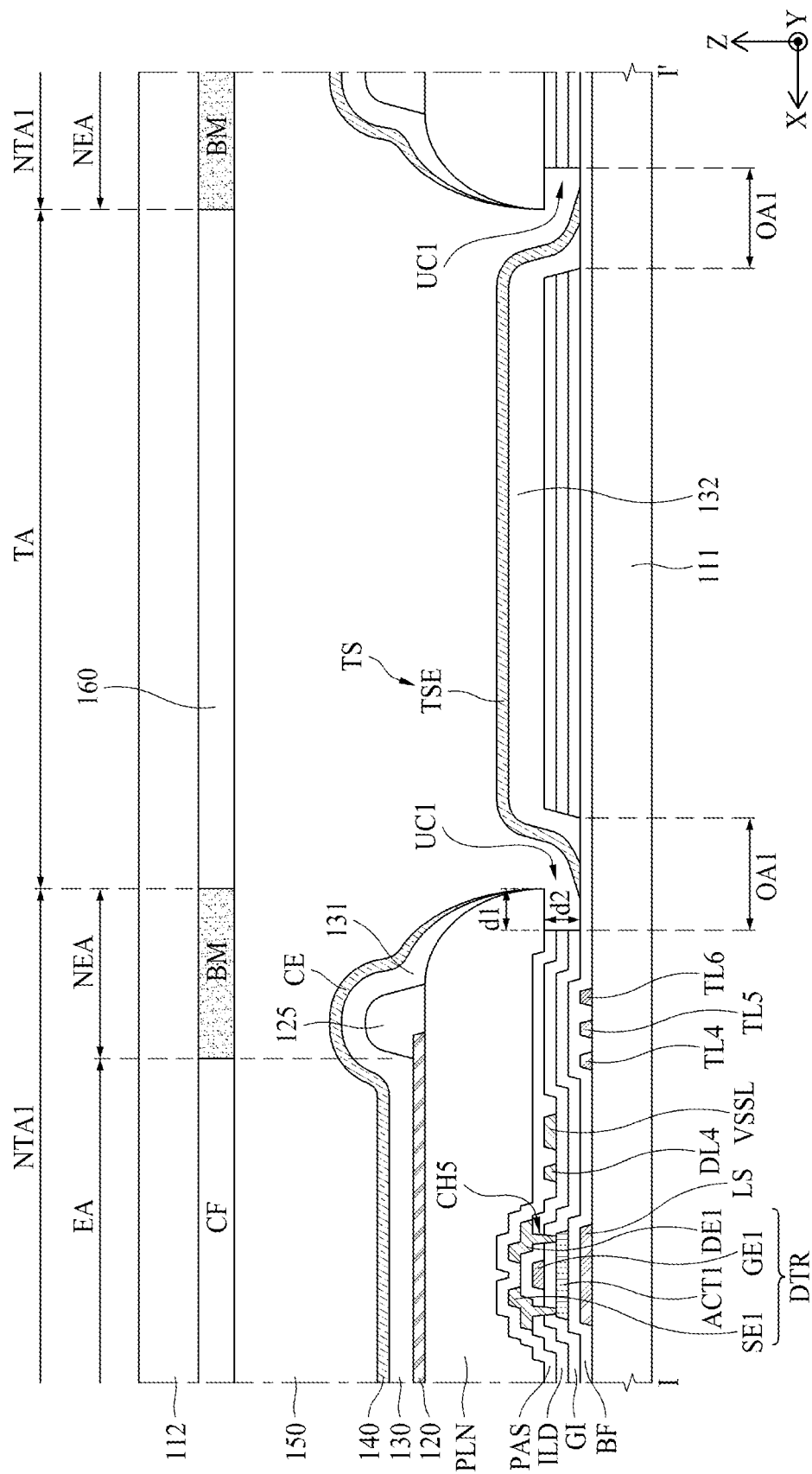
FIG. 6 is a cross-sectional view taken along line I-I' of FIG. 3.
Figure 7:
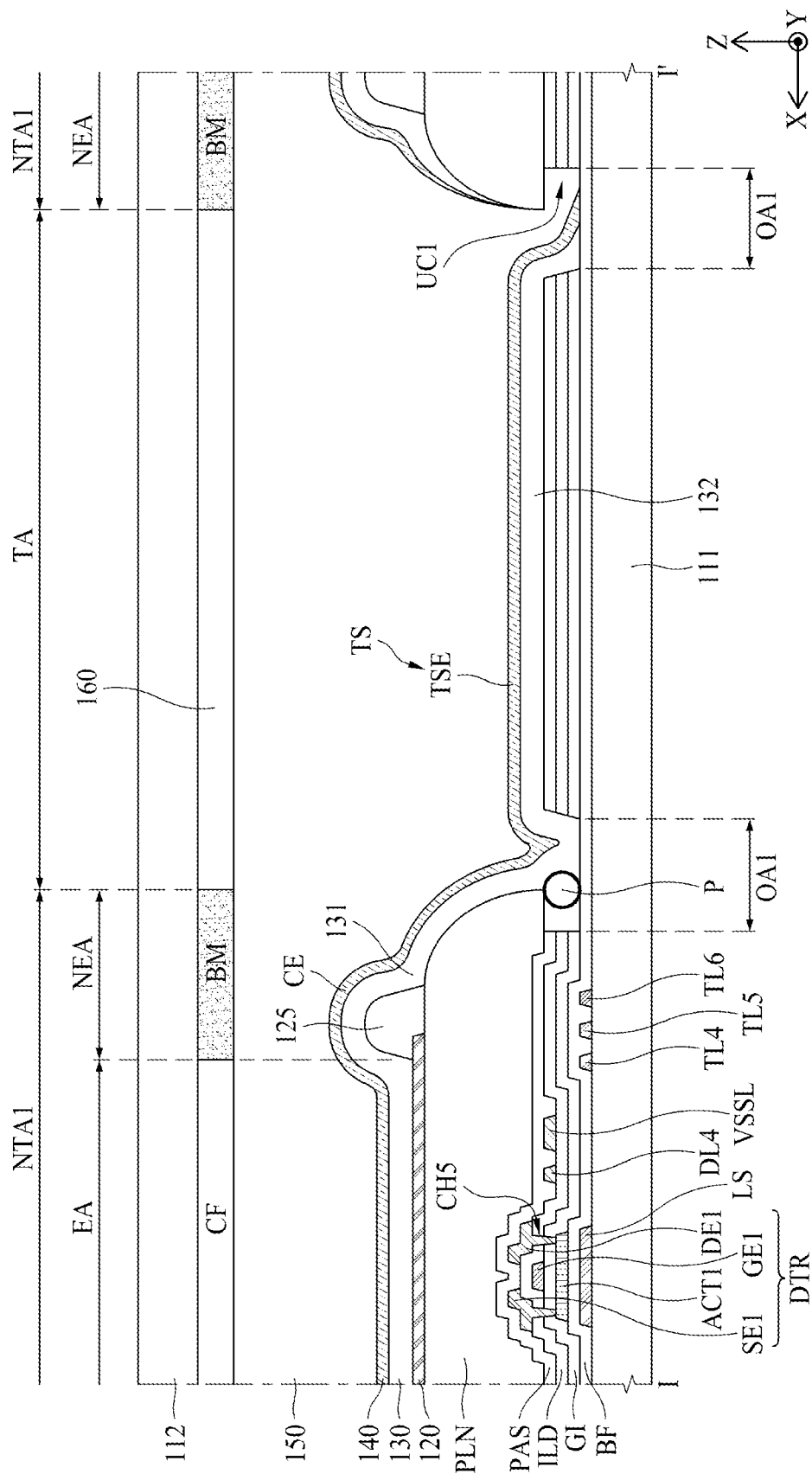
FIG. 7 is a view illustrating an example that a defective touch sensor occurs in a first undercut structure due to particles.

FIG. 6 is a cross-sectional view taken along line I-I' of FIG. 3, and FIG. 7 is a view illustrating an example that a defective touch sensor occurs in a first undercut structure due to particles.

Referring to FIGS. 3. 6 and 7, a first substrate 111 of the transparent display panel 110 according to one embodiment of the present disclosure may include a plurality of transmissive areas TA, and a non-transmissive area NTA that includes a plurality of light emission areas EA disposed between the transmissive areas TA adjacent to each other. The non-transmissive area NTA may include a first non-transmissive area NTA1 extended in a first direction (e.g., Y-axis direction) and a second non-transmissive area NTA2 extended in a second direction (e.g., X-axis direction).

The first non-transmissive area NTA1 includes circuit areas CA1, CA2, CA3 and CA4 in which at least one transistor and a capacitor are disposed, and may be provided with a pixel power line VDDL, a common power line VSSL, a reference line REFL, data lines DL and touch lines TL, which are extended in the first direction (e.g., Y-axis direction) and disposed so as not to overlap the circuit areas CA1, CA2, CA3 and CA4. The second non-transmissive area NTA2 may include a scan line SCANL and a touch bridge line TBL, which are extended in the second direction (e.g., X-axis direction).

At least one transistor may include a drive transistor DTR and switching transistors. The switching transistor may be switched in accordance with a scan signal supplied to the scan line SCANL to charge a data voltage supplied from the data line DL in the capacitor.

The driving transistor DTR is switched in accordance with the data voltage charged in the capacitor to generate a data current from a power source supplied from the pixel power line VDDL and supply the data current to a first electrode 120 of the subpixels SP1, SP2, SP3 and SP4. The driving transistor DTR may include an active layer ACT1, a gate electrode GE1, a source electrode SE1, and a drain electrode DE1.

As shown in FIG. 6, a light shielding layer LS may be provided over the first substrate 111. The light shielding layer LS may serve to shield external light incident on an active layer ACT1 in an area in which a driving transistor DTR is provided. The light shielding layer LS may include a single layer or multi-layer made of any one of molybdenum (Mo), aluminum (Al), chromium (Cr), gold (Au), titanium (Ti), nickel (Ni), neodymium (Nd) and copper (Cu), or their alloy.

The transparent display panel 110 according to one embodiment of the present disclosure may form at least one of the pixel power line VDDL, the common power line VSSL, the reference line REFL, the data lines DL, the touch lines TL, the touch bridge line TBL and the sensing line SSL in the same layer as the light shielding layer LS. For example, the reference line REFL, the touch lines TL, the touch bridge line TBL and the sensing line SSL may include the same material as that of the light shielding layer LS and may be provided in the same layer as the light shielding layer LS, but are not limited thereto.

A buffer layer BF may be provided over the light shielding layer LS. The buffer layer BF is to protect the transistors DTR from water permeated through the first substrate 111 vulnerable to water permeation, and may include an inorganic layer, for example, a silicon oxide layer (SiOx), a silicon nitride layer (SiNx) or a multi-layer of the silicon oxide layer and the silicon nitride layer.

An active layer ACT1 of the driving transistor DTR may be provided over the buffer layer BF. The active layer ACT1 may include a silicon-based semiconductor material or an oxide-based semiconductor material.

A gate insulating layer GI may be provided over the active layer ACT1 of the driving transistor DTR. The gate insulating layer GI may be provided in the non-transmissive area NTA and the transmissive area TA. However, in order to form the first undercut structure UC1 in the transmissive area TA, the gate insulating layer GI may be provided with a first opening area OA1 that is formed to expose the buffer layer BF without being provided in at least a portion of the transmissive area TA. The gate insulating layer GI may include an inorganic layer, for example, a silicon oxide layer (SiOx), a silicon nitride layer (SiNx) or a multi-layer of the silicon oxide layer and the silicon nitride layer.

A gate electrode GE1 of the driving transistor DTR may be provided over the gate insulating layer GI. The gate electrode GE1 may include a single layer or multi-layer made of one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE1 of the driving transistor DTR. The interlayer dielectric layer ILD may be provided in the non-transmissive area NTA and the transmissive area TA. However, the interlayer dielectric layer ILD may be provided with a first opening area OA1, which exposes the buffer layer BF without being provided in at least a portion of the transmissive area TA, to form a first undercut structure UC1 in the transmissive area TA. The interlayer dielectric layer ILD may include an inorganic layer, for example, a silicon oxide layer (SiOx), a silicon nitride layer (SiNx) or a multi-layer of the silicon oxide layer and the silicon nitride layer.

A source electrode SE1 and a drain electrode DE1 of the driving transistor DTR may be provided over the interlayer dielectric layer ILD. The source electrode SE1 and the drain electrode DE1 of the driving transistor DTR may be connected to the active layer ACT1 of the driving transistor DTR through a fifth contact hole CH5 passing through the gate insulating layer GI and the interlayer dielectric layer ILD. The source electrode SE1 and the drain electrode DE1 of the driving transistor DTR may include a single layer or multi-layer made of one of molybdenum (Mo), aluminum (Al), chromium (Cr), gold (Au), titanium (Ti), nickel (Ni), neodymium (Nd) and copper (Cu), or their alloy.

In the transparent display panel 110 according to one embodiment of the present disclosure, at least one of the pixel power line VDDL, the common power line VSSL, the reference line REFL, the data lines DL, the touch lines TL, the touch bridge line TBL and the sensing line SSL may be provided in the same layer as the source electrode SE1 and the drain electrode DE1 of the driving transistor DTR. For example, the pixel power line VDDL, the common power line VSSL and the data lines DL may include the same material as that of the source electrode SE1 and the drain electrode DE1 in the same layer as the source electrode SE1 and the drain electrode DE1, but are not limited thereto.

The passivation layer PAS for insulating the driving transistor DTR may be provided over the source electrode SE1 and the drain electrode DE1 of the driving transistor DTR. The passivation layer PAS may be provided in the non-transmissive area NTA and the transmissive area TA. However, the passivation layer PAS may be provided with a first opening area OA1, which exposes the buffer layer BF without being provided in at least a portion of the transmissive area TA, to form the first undercut structure UC1 in the transmissive area TA. The first opening area OA1 of the passivation layer PAS may at least partially overlap the first opening area OA1 of the interlayer dielectric layer ILD and the first opening area OA1 of the gate insulating layer GI. The passivation layer PAS may include an inorganic layer, for example, a silicon oxide layer (SiOx), a silicon nitride layer (SiNx) or a multi-layer of the silicon oxide layer and the silicon nitride layer.

The planarization layer PLN may be provided over the passivation layer PAS to planarize a step difference due to the driving transistor DTR and the plurality of signal lines. The planarization layer PLN may be provided in the non-transmissive area NTA, and may not be provided in at least a portion of the transmissive area TA to form the first undercut structure UC1 in the transmissive area TA. The planarization layer PLN may include an organic layer such as an acrylic resin, an epoxy resin, a phenolic resin, a polyamide resin and a polyimide resin.

In the transparent display panel 110 according to one embodiment of the present disclosure, the first undercut structure UC1 may be formed using the planarization layer PLN and the plurality of inorganic insulating layers, for example, the passivation layer PAS, the interlayer dielectric layer ILD and the gate insulating layer GI. In detail, the first undercut structure UC1 may be formed in such a manner that the planarization layer PLN is more protruded than the plurality of inorganic insulating layers, for example, the passivation layer PAS, the interlayer dielectric layer ILD and the gate insulating layer GI in a direction of the transmissive area TA. Therefore, the first undercut structure UC1 may expose at least a portion of the lower surface of the planarization layer PLN, and the plurality of inorganic insulating layers may not be provided below the exposed lower surface so that a gap space with the buffer layer BF may be provided.

The first undercut structure UC1 may be formed through a wet etching process. The wet etching process for forming the first undercut structure UC1 may be isotropic etching in view of properties. Therefore, in the first undercut structure UC1, a first gap distance d1 from an end of the planarization layer PLN to an end of the plurality of inorganic insulating layers may be formed in the same manner as a second gap distance d2 from the lower surface of the planarization layer PLN to the upper surface of the buffer layer BF. At this time, the first gap distance d1 of the first undercut structure UC1 should have a minimum distance value, for example, 2 um or more in order to make sure of isolation between the cathode electrode CE and the touch sensor electrode TSE. Therefore, since the second gap distance d2 of the first undercut structure UC1 should be greater than or equal to 2 um, a sum of thicknesses of the passivation layer PAS, the interlayer insulating film ILD and the gate insulating film GI may be 2 um or more.

The first undercut structure UC1 is provided in the transmissive area TA, and may have a planar closed shape. For example, the first undercut structure UC1 may be provided along an edge of the transmissive area TA. At this time, the first undercut structure UC1 may be provided to surround the touch sensor TS.

In the transparent display panel 110 according to one embodiment of the present disclosure, the first undercut structure UC1 may be formed using the planarization layer PLN and the plurality of inorganic insulating layers, whereby light transmittance may be prevented from being reduced due to the first undercut structure UC1.

A light emitting element, which includes a first electrode 120, an organic light emitting layer 130 and a second electrode 140, and a bank 125 may be provided over the planarization layer PLN.

The first electrode 120 may be provided over the planarization layer PLN for each of the subpixels SP1, SP2, SP3 and SP4. The first electrode 120 is not provided in the transmissive area TA. The first electrode 120 may be connected to the driving transistor DTR. In detail, the first electrode 120 may be connected to one of the source electrode SE1 and the drain electrode DE1 of the driving transistor DTR through a contact hole (not shown) that passes through the planarization layer PLN and the passivation layer PAS.

The first electrode 120 may include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti). The first electrode 120 may be an anode electrode of the light emitting element.

The bank 125 may be provided over the planarization layer PLN. The bank 125 may be provided to at least partially cover an edge of the first electrode 120 and expose a portion of the first electrode 120. Therefore, the bank 125 may prevent a problem in which light emitting efficiency is deteriorated due to concentration of a current on an end of the first electrode 120.

The bank 125 may define light emission areas EA1, EA2, EA3 and EA4 of the subpixels SP1, SP2, SP3 and SP4. The light emission areas EA1, EA2, EA3 and EA4 of each of the subpixels SP1, SP2, SP3 and SP4 represent an area in which the first electrode 120, the organic light emitting layer 130 and the cathode electrode CE are sequentially stacked and holes from the first electrode 120 and electrons from the cathode electrode CE are combined with each other in the organic light emitting layer 130 to emit light. In this case, the area in which the bank 125 is provided may become the non-light emission area NEA because light is not emitted therefrom, and the area in which the bank 125 is not provided and the first electrode is exposed may become the light emission area EA.

The bank 125 may include an organic layer such as an acrylic resin, an epoxy resin, a phenolic resin, a polyamide resin, and a polyimide resin.

The organic light emitting layer 130 may be disposed over the first electrode 120. The organic light emitting layer 130 may include a hole transporting layer, a light emitting layer and an electron transporting layer. In this case, when a voltage is applied to the first electrode 120 and the cathode electrode CE, holes and electrons move to the light emitting layer through the hole transporting layer and the electron transporting layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, the light emitting layer of the organic light emitting layer 130 may be provided for each of the subpixels SP1, SP2, SP3 and SP4. For example, a green light emitting layer for emitting green light may be provided in the first subpixel SP1, a red light emitting layer for emitting red light may be provided in the second subpixel SP2, a blue light emitting layer for emitting blue light may be provided in the third subpixel SP3, and a white light emitting layer for emitting white light may be provided in the fourth subpixel SP4. In this case, the light emitting layer of the organic light emitting layer 130 is not provided in the transmissive area TA.

An organic light emitting layer 130 may be separated from the non-transmissive area NTA and the transmissive area TA by the first undercut structure UC1. In detail, the organic light emitting layer 130 may be separated from an organic light emitting layer 131 provided in the non-transmissive area NTA and an organic light emitting layer 132 provided in the transmissive area TA by the first undercut structure UC1. That is, the organic light emitting layer 131 provided in the non-transmissive area NTA and the organic light emitting layer 132 provided in the transmissive area TA may be spaced apart from each other by the first undercut structure UC1.

A second electrode 140 may be disposed over the organic light emitting layer 130 and the bank 125. When the second electrode 140 is deposited on an entire surface, the second electrode 140 may be separated without being continuous between the non-transmissive area NTA and the transmissive area TA by the first undercut structure UC1. In detail, the second electrode 140 may be separated into a second electrode CE provided in the non-transmissive area NTA and a second electrode TSE provided in the transmissive area TA by the first undercut structure UC1. In this case, the second electrode CE provided in the non-transmissive area NTA may be a cathode electrode CE, and is an element constituting a light emitting element. The cathode electrode CE may be connected to a cathode contact portion CCT to receive a power source from the common power line VSSL. The cathode electrode CE may be a common layer that is commonly provided in the subpixels SP1, SP2, SP3 and SP4 to apply the same voltage.

Also, the second electrode TSE provided in the transmissive area TA is a touch sensor electrode TSE, and may be an element constituting the touch sensor TS. The touch sensor electrode TSE may be connected to a second touch contact electrode TCT2 to provide a change in capacitance to the touch line TL.

The second electrode 140, which includes the cathode electrode CE and the touch sensor electrode TSE, may include a transparent conductive material (TCO) such as ITO and IZO, which may transmit light, or a semi-transmissive conductive material such as magnesium (Mg), silver (Ag) or an alloy of magnesium (Mg) and silver (Ag). When the second electrode 140 includes a semi-transmissive conductive material, light emitting efficiency may be increased by a micro cavity.

An encapsulation layer 150 may be provided over the light emitting elements and the touch sensors TS. The encapsulation layer 150 may be provided over the cathode electrode CE and the touch sensor electrode TSE to at least partially cover the cathode electrode CE and the touch sensor electrode TSE. The encapsulation layer 150 serves to prevent oxygen or water from being permeated into the organic light emitting layer 130, the cathode electrode CE and the touch sensor electrode TSE. Accordingly, in some embodiments, the encapsulation layer 150 may include at least one inorganic layer and at least one organic layer.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels SP1, SP2, SP3 and SP4. A black matrix BM may be provided between color filters CF. The black matrix BM may be disposed between the subpixels SP1, SP2, SP3 and SP4 to prevent a color mixture from occurring between adjacent subpixels SP1, SP2, SP3 and SP4. In addition, the black matrix BM may prevent light incident from the outside from being reflected by the plurality of lines, for example, the scan lines SCANL, the pixel power line VDDL, the common power line VSSL, the reference line REFL, data lines DL, etc., provided between the subpixels SP1, SP2, SP3 and SP4.

In the transparent display panel 110 according to one embodiment of the present disclosure, the touch sensor electrode TSE of the touch sensor TS and the cathode electrode CE of the light emitting element may be provided in the same layer using the first undercut structure UC1. In the transparent display panel 110 according to one embodiment of the present disclosure, a touch process is simplified, and a separate mask for the touch sensor electrode TSE is not required.

Also, in the transparent display panel 110 according to one embodiment of the present disclosure, the first undercut structure UC1 may be formed using the planarization layer PLN and the plurality of inorganic insulating layers, whereby the first undercut structure UC1 may be formed without loss of light transmittance.

Also, in the transparent display panel 110 according to one embodiment of the present disclosure, the touch lines TL may be disposed below the light emitting element, whereby light emitting efficiency of the pixel P may be prevented from being deteriorated due to the touch lines TL.

Also, in the transparent display panel 110 according to one embodiment of the present disclosure, the touch lines TL may be disposed so as not to overlap the circuit areas CA1, CA2, CA3 and CA4, whereby influence caused by the circuit element may be reduced or minimized and at the same time uniformity of parasitic capacitance may be improved.

Also, in the transparent display panel 110 according to one embodiment of the present disclosure, the plurality of touch lines TL may be disposed in the first non-transmissive area NTA1, and only one touch bridge line TBL for connecting the plurality of touch sensors TS may be provided in the second non-transmissive area NTA2, whereby decrease in a size of the transmissive area TA or decrease in light transmittance due to the plurality of touch lines TL and the touch bridge line TBL may be reduced or minimized.

As described above, in the transparent display panel 110 according to one embodiment of the present disclosure, the touch sensor electrode TSE of the touch sensor TS and the cathode electrode CE of the light emitting element may be separated from each other by the first undercut structure UC1. However, in the manufacturing process, particles P may occur in the first undercut structure UC1 as shown in FIG. 7. In this case, the touch sensor electrode TSE of the touch sensor TS and the cathode electrode CE of the light emitting element may be electrically connected to each other without being separated from each other.

Since all of the touch sensors TS included in one touch block TB are electrically connected to one another, all the touch sensors TS included in the corresponding touch block TB are not normally operated even though a defect occurs only in one of the touch sensors TS. Therefore, as shown in FIG. 7, when the touch sensor electrode TSE of the touch sensor TS and the cathode electrode CE of the light emitting element are connected to each other to generate the defective touch sensor TS, a touch of a user is not sensed in the entire touch block TB in which the defective touch sensor TS is included. In this case, a plurality of defective touch sensors TS may be generated, and may be disposed on their respective touch blocks TB different from one another. In this case, all of the plurality of touch blocks TB in which the plurality of defective touch sensors TS are disposed may not sense the touch, and consequently, a touch defect rate of the transparent display panel 110 may be increased.

The transparent display panel 110 according to one embodiment of the present disclosure may include elements capable of specifying the defective touch sensor TS of the plurality of touch sensors TS included in one touch block TB. In addition, in the transparent display panel 110 according to one embodiment of the present disclosure, the defective touch sensors TS and the touch bridge line TCL may be electrically separated from each other through a repair process.

Hereinafter, the elements capable of detecting the defective touch sensor TS will be described with reference to FIGS. 3 and 8 to 18, and a case that the defective touch sensor TS is detected using the elements will be described.

Figure 8:
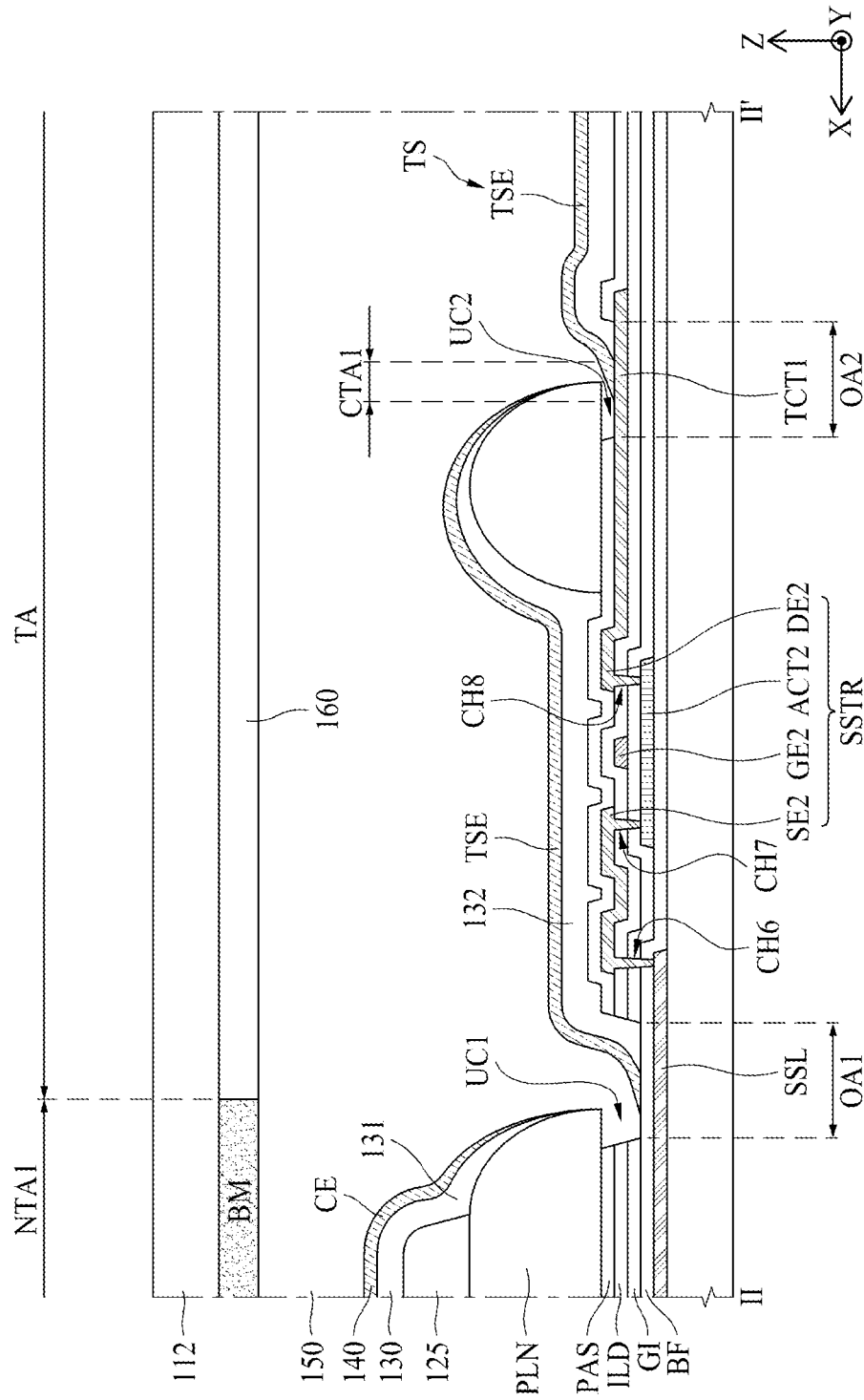
FIG. 8 is a cross-sectional view taken along line II-IP of FIG. 3.
Figure 9:
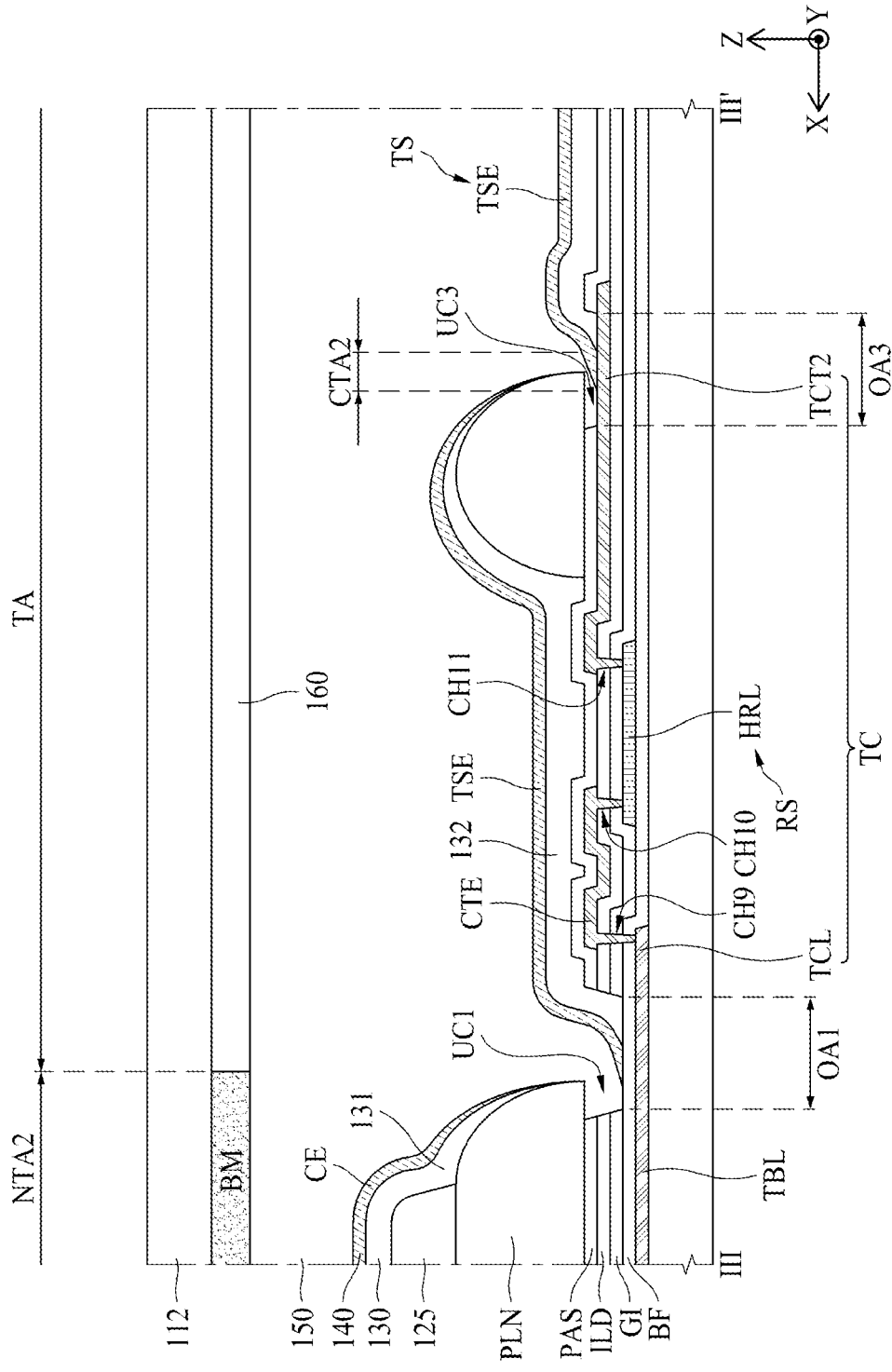
FIG. 9 is a cross-sectional view taken along line of FIG. 3.

FIG. 8 is a cross-sectional view taken along line II-IP of FIG. 3, and FIG. 9 is a cross-sectional view taken along line of FIG. 3.

Referring to FIGS. 3, 8 and 9, the transparent display panel 110 according to one embodiment of the present disclosure may further include a sensing transistor SSTR for connecting the touch sensor TS with the sensing line SSL, and a touch connection portion TC for connecting the touch sensor TS with the touch bridge line TBL, and may detect a defective touch sensor TS by using the sensing transistor SSTR and the touch connection portion TC. Also, in the transparent display panel 110 according to one embodiment of the present disclosure, when the defective touch sensor TS is detected, the touch connection portion TC for connecting the defective touch sensor TS with the touch bridge line TBL may be cut by a laser, so that the defective touch sensor TS and the touch bridge line TBL may be electrically separated from each other. As a result, the other touch sensors TS of the corresponding touch block TB may be normally operated.

Each of the plurality of sensing transistors SSTR may be connected to the touch sensor TS to transfer the voltage of the touch sensor TS to the sensing line SSL. In detail, the sensing transistor SSTR may be provided to at least partially overlap the touch sensor TS as shown in FIGS. 3 and 8, and thus may be connected to the touch sensor TS and the sensing line SSL. The sensing transistor SSTR may include an active layer ACT2, a gate electrode GE2, a source electrode SE2, and a drain electrode DE2. In FIGS. 3 and 8, the active layer ACT2, the gate electrode GE2, the source electrode SE2 and the drain electrode DE2 of the sensing transistor SSTR are illustrated as being all disposed to overlap the touch sensor electrode TSE, but are not limited thereto. In another embodiment, at least a portion of the drain electrode DE2 and the active layer ACT2 of the sensing transistor SSTR may at least partially overlap the touch sensor electrode TSE, and the gate electrode GE2 and the source electrode SE2 thereof may be provided between the touch sensor electrode TSE and the sensing line SSL.

The gate electrode GE2 of the sensing transistor SSTR may be connected to the scan line SCANL. The active layer ACT2 of the sensing transistor SSTR may be provided below the gate electrode GE2 to at least partially overlap the gate electrode GE2. The active layer ACT2 may be connected to the source electrode SE2 at one end through a seventh contact hole CH7, and may be connected to the drain electrode DE2 at the other end through an eighth contact hole CH8.

The source electrode SE2 of the sensing transistor SSTR may be connected to the sensing line SSL at one end through a sixth contact hole CH6, and may be connected to the active layer ACT2 at the other end through the seventh contact hole CH7. The drain electrode DE2 of the sensing transistor SSTR may be connected to the active layer ACT2 at one end through the eighth contact hole CH8, and may be in contact with a first touch contact electrode TCT1 at the other end. The drain electrode DE2 of the sensing transistor SSTR and the first touch contact electrode TCT1 may be formed in a single body.

The first touch contact electrode TCT1 may be provided in the transmissive area TA. The first touch contact electrode TCT1 may electrically connect the drain electrode DE2 with the touch sensor electrode TSE. A portion of an upper surface of the first touch contact electrode TCT1 may be exposed by a second undercut structure UC2, and the touch sensor electrode TSE may be connected to the exposed upper surface.

In detail, the first touch contact electrode TCT1 may be provided in a layer provided between the buffer layer BF and the passivation layer PAS. In one embodiment, the first touch contact electrode TCT1 may be disposed between the interlayer dielectric layer ILD and the passivation layer PAS. In this case, the passivation layer PAS may be provided with a second opening area OA2 that is formed to expose at least a portion of the upper surface of the first touch contact electrode TCT1. The second undercut structure UC2 may be formed in such a manner that the planarization layer PLN is more protruded than the passivation layer PAS in the second opening area OA2 of the passivation layer PAS. Therefore, the second undercut structure UC2 may expose at least a portion of the lower surface of the planarization layer PLN, and may expose at least a portion of the upper surface of the first touch contact electrode TCT1 without having the passivation layer PAS below the exposed lower surface.

The second undercut structure UC2 may be provided inside the area where the first undercut structure UC1 is provided. That is, the second undercut structure UC2 may be disposed in the area in which the touch sensor TS is provided.

The touch sensor electrode TSE may be deposited on the exposed upper surface of the first touch contact electrode TCT1 to form a first contact area CTA1, and may be electrically connected to the first touch contact electrode TCT1.

As described above, the gate electrode GE2 of the sensing transistor SSTR may be connected to the scan line SCANL, and the source electrode SE2 thereof may be connected to the sensing line SSL. Further, the drain electrode DE2 of the sensing transistor SSTR may be connected to the touch sensor electrode TSE of the touch sensor TS. The sensing transistor SSTR may be turned on in response to the scan signal applied through the scan line SCANL. When the sensing transistor SSTR is turned on, a voltage of the touch sensor electrode TSE may be transferred to the sensing line SSL.

Meanwhile, each of the plurality of touch sensors TS may be connected to the touch bridge line TBL through the touch connection portion TC as shown in FIGS. 3 and 9. The touch connection portion TC may at least partially overlap the touch sensor TS at one end, and may at least partially overlap the touch bridge line TBL at the other end to connect the touch sensor TS with the touch bridge line TBL. The touch connection portion TC may include a touch connection line TCL, a resistance sensor RS including a high resistance area, a connection electrode CTE, and a second touch contact electrode TCT2.

The touch connection line TCL may connect the touch bridge line TBL with the resistance sensor RS. In detail, one end of the touch connection line TCL may be connected to the touch bridge line TBL, and the other end thereof may be connected to the connection electrode CTE through a ninth contact hole CH9 and connected to the resistance sensor RS through the connection electrode CTE, but the present disclosure is not limited thereto. The touch connection line TCL may be directly connected to the resistance sensor RS.

The touch connection line TCL may be provided in a layer provided between the first substrate 111 and the driving transistor DTR. In one embodiment, the touch connection line TCL may include the same material as that of the light shielding layer LS in the same layer as the light shielding layer LS. Since the touch connection line TCL is extended from the touch bridge line TBL disposed in the second non-transmissive area NTA to the resistance sensor RS disposed in the transmissive area TA, the touch connection line TCL crosses the first undercut structure UC1. The first undercut structure UC1 may be formed through a wet etching process. In the transparent display panel 110 according to one embodiment of the present disclosure, the touch connection line TCL may be provided in the same layer as the light shielding layer LS so that the touch connection line TCL may be prevented from being lost in the wet etching process for forming the first undercut structure UC1.

The connection electrode CTE may electrically connect the touch connection line TCL with the resistance sensor RS. One end of the connection electrode CTE may be connected to the touch connection line TCL through the ninth contact hole CH9, and the other end thereof may be connected to the resistance sensor RS through a tenth contact hole CH10. In one embodiment, the connection electrode CTE may be disposed in the same layer as the source electrode SE1 and the drain electrode DE1 of the driving transistor DTR.

The resistance sensor RS may be disposed between the touch connection line TCL and the second touch contact electrode TCT2, and may include a high resistance line HRL. One end of the high resistance line HRL may be connected to the connection electrode CTE through the tenth contact hole CH10, and the other end thereof may be connected to the second touch contact electrode TCT2 through an eleventh contact hole CH11. Although FIG. 8 shows that the high resistance line HRL is connected to the touch connection line TCL through the connection electrode CTE, but the high resistance line HRL is not limited thereto. In another embodiment, the high resistance line HRL may be directly connected to the touch connection line TCL.

The high resistance line HRL may be made of a silicon-based semiconductor material or oxide-based semiconductor material to implement high resistance. For example, the high resistance line HRL may include the same material as that of an active layer ACT1 of the driving transistor DTR in the same layer as the active layer ACT1.

The second touch contact electrode TCT2 may be provided in the transmissive area TA. The second touch contact electrode TCT2 may be disposed between high resistance line HRL and the touch sensor electrode TSE to electrically connect the high resistance line HRL with the touch sensor electrode TSE. The second touch contact electrode TCT2 may be connected to the high resistance line HRL through the eleventh contact hole CH111.

At least a portion of an upper surface of the second touch contact electrode TCT2 may be exposed by a third undercut structure UC3, and the touch sensor electrode TSE may be connected to the exposed upper surface. In detail, the second touch contact electrode TCT2 may be formed in a layer provided between the buffer layer BF and the passivation layer PAS. In one embodiment, the second touch contact electrode TCT2 may be provided between the interlayer dielectric layer ILD and the passivation layer PAS. In this case, the passivation layer PAS may be provided with a third opening area OA3 that is formed to expose at least a portion of the upper surface of the second touch contact electrode TCT2. The third undercut structure UC3 may be formed in such a manner that the planarization layer PLN is more protruded than the passivation layer PAS in the third opening area OA3 of the passivation layer PAS. Therefore, the third undercut structure UC3 may expose at least a portion of the lower surface of the planarization layer PLN, and may expose at least a portion of the upper surface of the second touch contact electrode TCT2 without having the passivation layer PAS below the exposed lower surface.

The third undercut structure UC3 may be provided inside the area in which the first undercut structure UC1 is provided. That is, the third undercut structure UC3 may be disposed in the area in which the touch sensor TS is provided.

The touch sensor electrode TSE may be deposited on the exposed upper surface of the second touch contact electrode TCT2 to form a second contact area CTA2, and may be electrically connected to the second touch contact electrode TCT2. The second touch contact electrode TCT2 may transfer a change in capacitance of the touch sensor electrode TSE to the touch line TL through the touch connection line TCL, the high resistance line HRL and the touch bridge line TBL.

Figure 10:
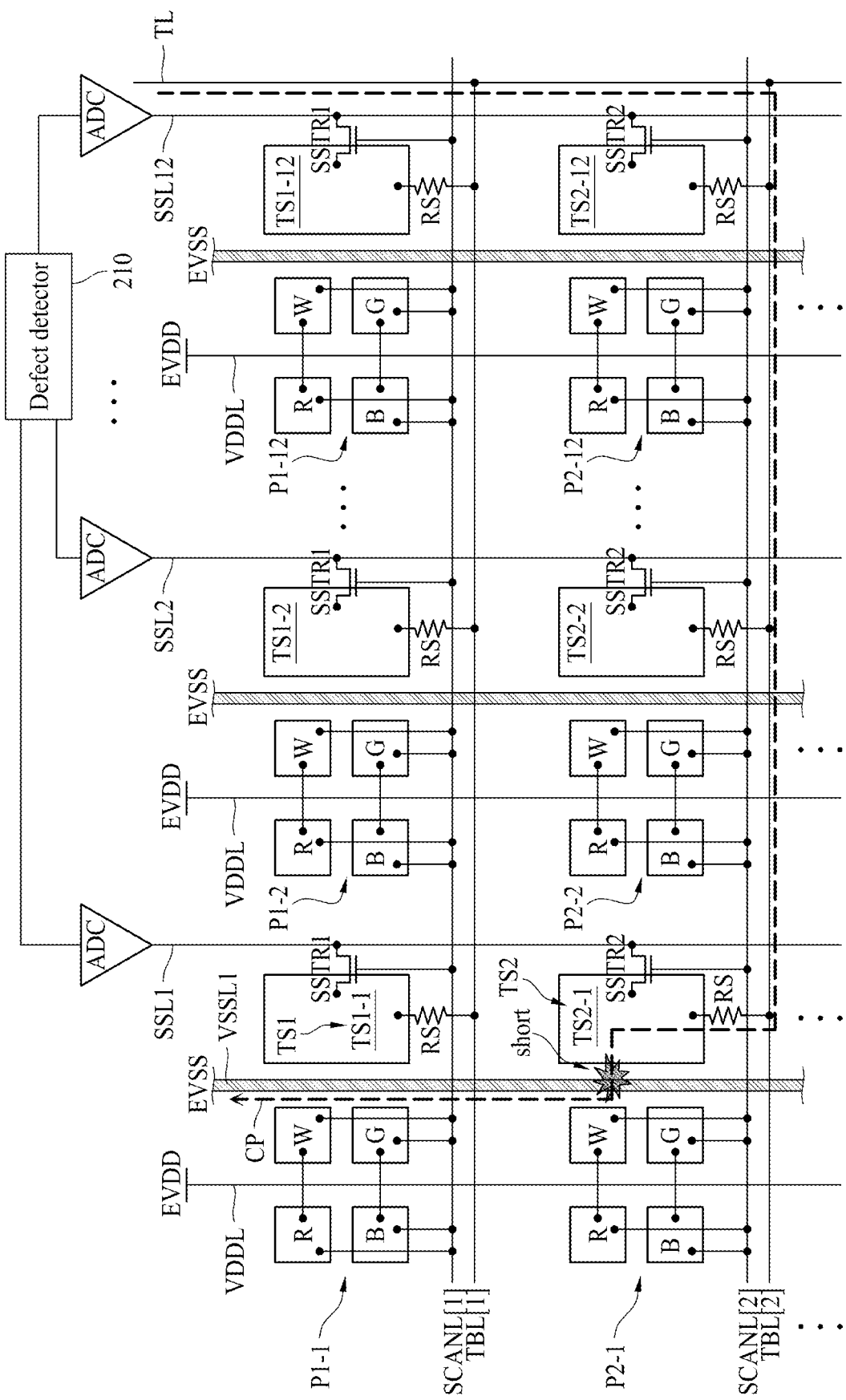
FIG. 10 is a view illustrating a current path when a defective touch sensor occurs.
Figure 11:
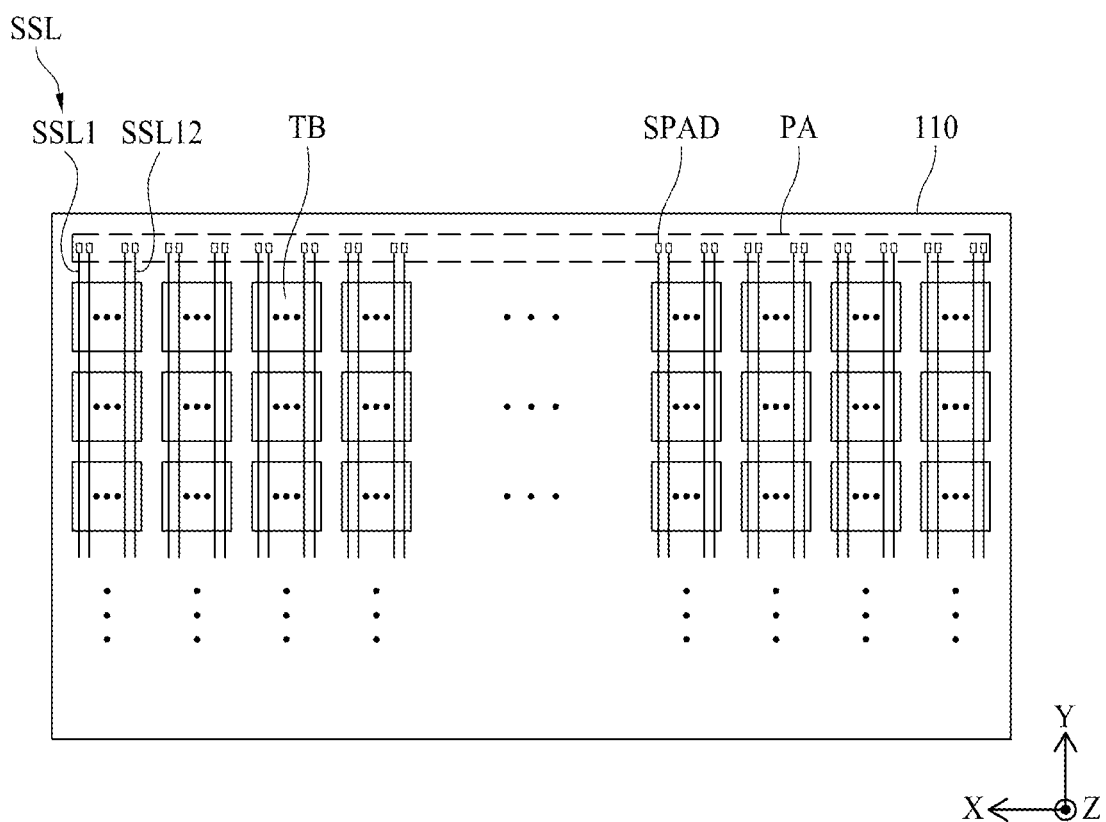
FIG. 11 is a view illustrating a plurality of sensing lines disposed in a plurality of touch blocks.
Figure 12:
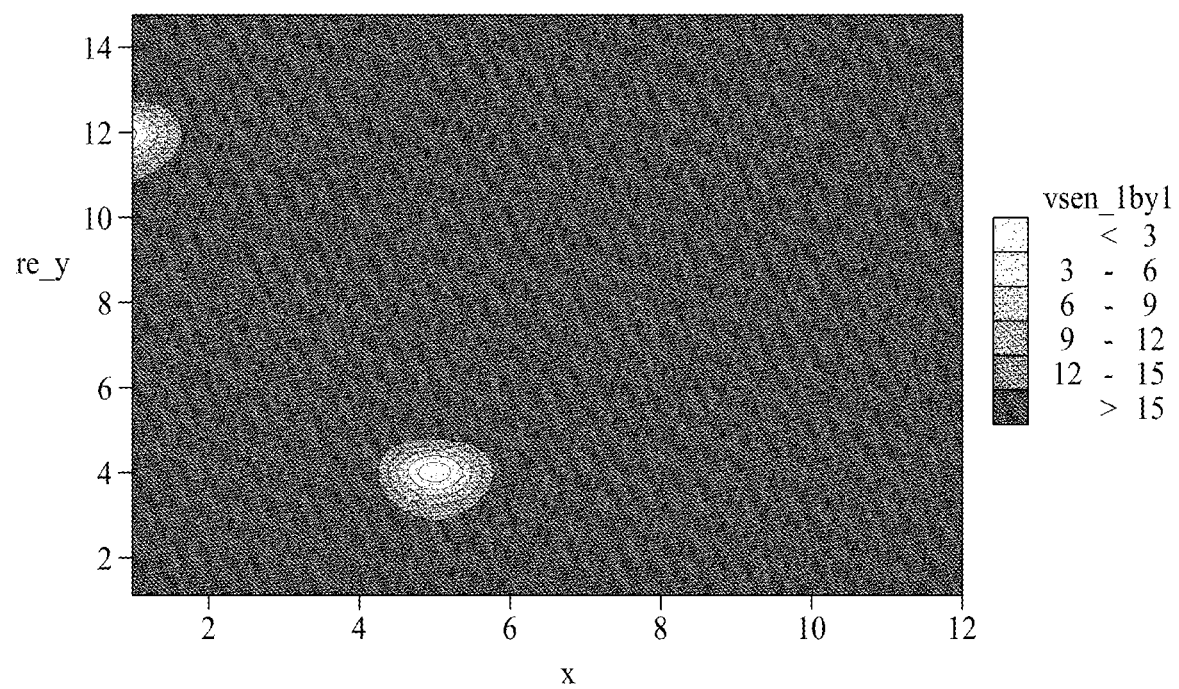
FIG. 12 is a view illustrating a voltage difference between a normal touch sensor and a defective touch sensor.

FIG. 10 is a view illustrating a current path when a defective touch sensor occurs, FIG. 11 is a view illustrating a plurality of sensing lines disposed in a plurality of touch blocks, and FIG. 12 is a view illustrating a voltage difference between a normal touch sensor and a defective touch sensor.

Referring to FIGS. 10 to 12, in the transparent display panel 110 according to one embodiment of the present disclosure, the defective touch sensor TS may be detected using the sensing transistor SSTR and the resistance sensor RS.

In detail, as described above, particles P may occur in the first undercut structure UC1, and the touch sensor electrode TSE of the touch sensor TS and the cathode electrode CE of the light emitting element may be electrically connected to each other without being separated from each other. In such a defective touch sensor TS2-1, when respective voltages different from each other are applied to the touch line TL and the common power line VSSL as shown in FIG. 10, a current flows from the touch sensor electrode TSE to the cathode electrode CE.

For example, a first voltage, e.g., 20V, may be applied to the touch line TL, and a second voltage, e.g., 0V, may be applied to the common power line VSSL. Since the touch sensor electrode TSE is electrically connected with the cathode electrode CE of the light emitting element, a current path CP may be generated from the touch sensor electrode TSE of the defective touch sensor TS2-1 to the cathode electrode CE. At this time, if the resistance sensor RS is provided on the current path CP, a voltage of the defective touch sensor TS2-1 is reduced by high resistance of the resistance sensor RS. On the other hand, since no current flows to the touch sensor electrode TSE of normal touch sensors TS1-1, TS1-2, . . . , TS1-12, TS2-2, . . . , TS2-12, the voltage applied from the touch line TL may be maintained in the normal touch sensors TS1-1, TS1-2, . . . , TS1-12, TS2-2, . . . , TS2-12 TS1.

The sensing transistors SSTR respectively connected to a plurality of touch sensors TS1 and TS2 may be sequentially turned on in accordance with scan signals applied through scan lines SCANL[1] and SCANL[2]. When the sensing transistor SSTR is turned on, the voltage of the touch sensor electrode TSE may be applied to an analog-to-digital (AD) converter ADC through the sensing line SSL.

At this time, the plurality of sensing lines SSL may individually sense the voltages of the plurality of touch sensors TS. In detail, each of the plurality of touch blocks TB may be provided with a plurality of sensing lines SSL as shown in FIG. 11. One touch block TB may be provided with a plurality of touch sensors TS comprised of M number of rows and N number of columns, and a plurality of sensing lines SSL disposed to correspond to the N number of columns (wherein M and N are natural numbers greater than 1). Each of the plurality of sensing lines SSL may be extended in the first direction (e.g., Y-axis direction) and connected to M number of touch sensors TS disposed in a line in the first direction (e.g., Y-axis direction). For example, one touch block TB may be provided with a plurality of touch sensors TS comprised of 15 rows and 12 columns, and 12 sensing lines SSL disposed to correspond to the 12 columns. Each of the 12 sensing lines SSL may be connected to 15 touch sensors disposed in a line in the first direction (e.g., Y-axis direction). Meanwhile, the 12 sensing lines SSL may be extended in the first direction (e.g., Y-axis direction) and connected to each of 12 sensing pads SPAD in a pad area PA.

That is, the plurality of sensing lines SSL may be disposed in one touch block TB, and voltages of the touch sensors TS included in the corresponding touch block TB may be individually sensed through the plurality of sensing lines SSL.

Referring back to FIG. 10, since the plurality of sensing transistors SSTR are sequentially turned on in accordance with the scan signals applied through the scan lines SCANL [1] and SCANL[2], each of the plurality of sensing lines SSL may sequentially sense the voltages of the plurality of touch sensors TS1 and TS2 disposed in a line in the first direction (e.g., Y-axis direction). For example, the first sensing line SSL1 may sequentially sense voltages of a plurality of touch sensors TS1-1 and TS2-1 disposed in a line in the first direction (e.g., Y-axis direction). When the scan signal is applied to the first scan line SCANL[1], a first sensing transistor SSTR1 connected to the first scan line SCANL[1] may be turned on. When the first sensing transistor SSTR1 is turned on, the voltage of the touch sensor electrode TSE of the first touch sensor TS1-1 may be applied through the first sensing transistor SSTR1. At this time, when the first touch sensor TS1-1 is a normal touch sensor, the voltage of the touch sensor electrode TSE of the first touch sensor TS1-1 may be equal to or similar to the first voltage applied to the touch line TL, for example, 20V.

When the scan signal is applied to the second scan line SCANL[2], a second sensing transistor SSTR2 connected to the second scan line SCANL[2] may be turned on. When the second sensing transistor SSTR2 is turned on, the voltage of the touch sensor electrode TSE of the second touch sensor TS2-1 may be applied through the second sensing transistor SSTR2. At this time, when the second touch sensor TS2-1 is a defective touch sensor TS2-1, since the voltage of the defective touch sensor TS2-1 is reduced by the high resistance of the resistance sensor RS, the voltage of the touch sensor electrode TSE of the defective touch sensor TS2-1 may have a value that is reduced more greatly than the first voltage applied to the touch line TL, for example, 20V.

The other sensing lines SSL including the second sensing line SSL2 may also sequentially sense the voltage of the plurality of touch sensors TS1-2, . . . , TS1-12, TS2-2, . . . , TS2-12 disposed in a line in the first direction (e.g., Y-axis direction) in the same manner as the first sensing line SSL1.

The AD converter (ADC) may convert the voltage of the touch sensor electrode TSE into digital sensing data and output the digital sensing data to a defect detection circuit 210 (or also referred to as a defect detector 210). In this case, the defect detector 210 may be an element included in an external circuit board (not shown), or may be an element included in an external defect inspection equipment.

The defect detector 210 may detect the defective touch sensor TS2-1 of the plurality of touch sensors TS based on the voltages of the plurality of touch sensors TS. The voltage of the defective touch sensor TS2-1 may be a voltage, which is reduced from the first voltage applied to the touch line TL as shown in FIG. 12, for example, 20V by line resistance of the touch line TL and the resistance sensor RS, for example, 2V or a voltage lower than 2V. On the other hand, the voltages of the normal touch sensors TS1-1, TS1-2, . . . , TS1-12, TS2-2, . . . , TS2-12 may be the first voltages applied to the touch line TL as shown in FIG. 12, for example, 20V or voltages a little reduced by line resistance of the touch line TL. The defect detector 210 may detect the touch sensor TS2-1, in which the voltage of each of the plurality of touch sensors TS sensed through the plurality of sensing lines SSL is lower than a reference value, as the defective touch sensor.

The transparent display panel 110 according to one embodiment of the present disclosure should include a high resistance area to generate a voltage difference between the defective touch sensor TS2-1 and the normal touch sensors TS1-1, TS1-2, . . . , TS1-12, TS2-2, . . . , TS2-12. When resistance is 0Ω, the voltage difference may not be generated between the defective touch sensor TS2-1 and the normal touch sensors TS1-1, TS1-2, . . . , TS1-12, TS2-2, . . . , TS2-12, and it may be difficult to detect the defective touch sensor TS2-1. Meanwhile, the voltage difference between the defective touch sensor TS2-1 and the normal touch sensors TS1-1, TS1-2, TS1-12, TS2-2, . . . , TS2-12 may be increased as the resistance is increased. When the case that the resistance is 1 kΩ and the case that the resistance is 1 MΩ are compared with each other, it is noted that the voltage difference between the defective touch sensor TS2-1 and the normal touch sensors TS1-1, TS1-2, . . . , TS1-12, TS2-2, . . . , TS2-12 is greater in the case that the resistance R is 1MΩ than the case that the resistance is 1 kΩ. That is, in the transparent display panel 110 according to one embodiment of the present disclosure, the defective touch sensor TS2-1 may be more easily detected as the resistance becomes high.

The resistance sensor RS may implement resistance of 1 kΩ or more by using the high resistance line HRL. However, in order to implement resistance of 1 MΩ, a length of the high resistance line HRL should be lengthened. Therefore, it is not easy to implement resistance of 1 MΩ by using the high resistance line HRL, and even though the resistance of 1 MΩ is implemented, light transmittance of the transmissive area TA may be reduced by the high resistance line HRL.

The transparent display panel 110 according to another embodiment of the present disclosure may apply a transistor instead of the resistance sensor RS to implement high resistance, for example, 1 MΩ.

Figure 13:
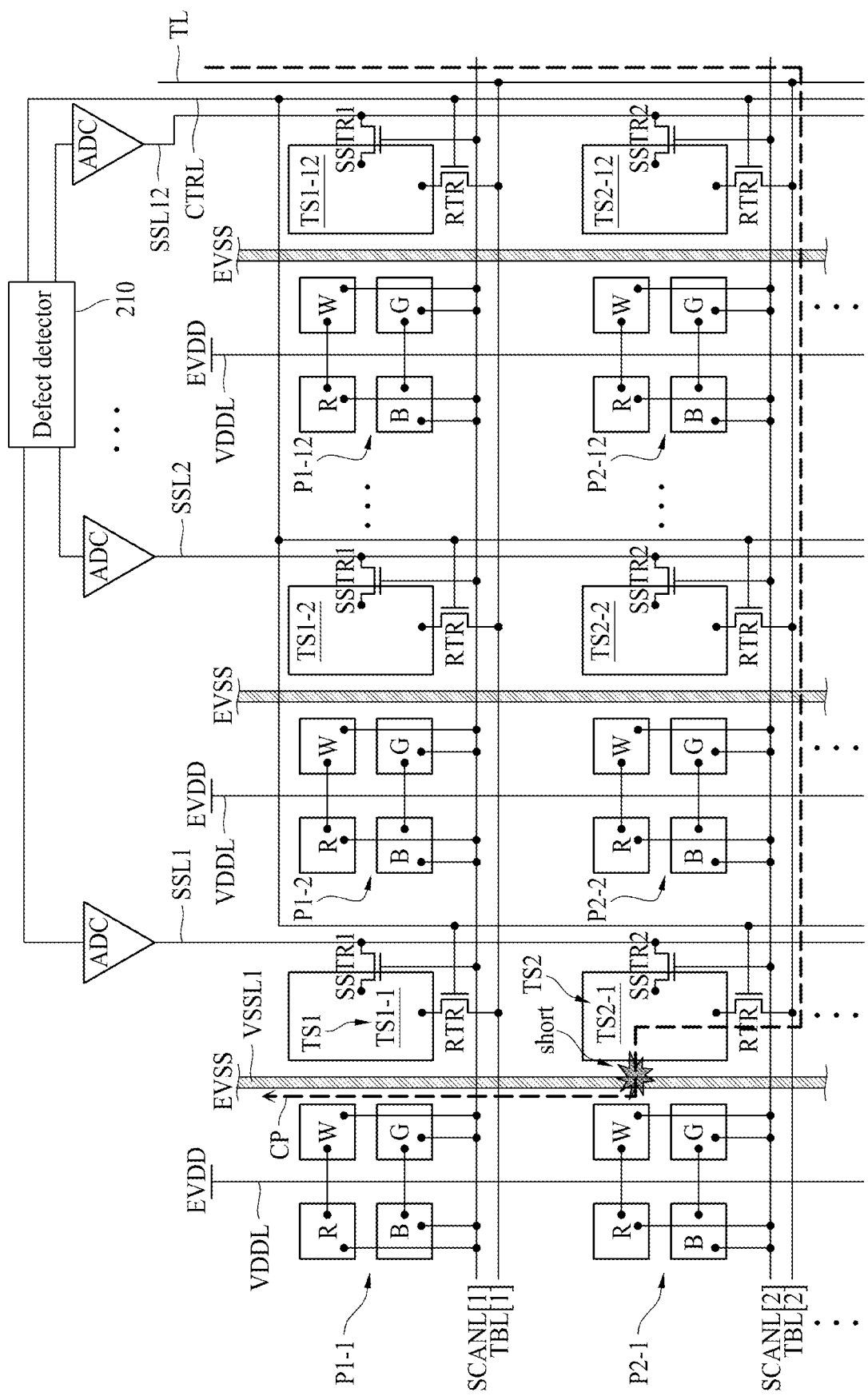
FIG. 13 is a view illustrating an example of a resistance transistor applied instead of a resistance sensor.

FIG. 13 is a view illustrating an example of a resistance transistor applied instead of a resistance sensor.

Referring to FIG. 13, the transparent display panel 110 according to another embodiment of the present disclosure may include a resistance transistor RTR between the touch bridge line TBL and the touch sensor TS. A gate electrode of the resistance transistor RTR may be connected to a separate control signal line CTRL, and a source electrode thereof may be connected to the touch bridge line TBL. Also, a drain electrode of the resistance transistor RTR may be connected to the touch sensor electrode TSE of the touch sensor TS. The resistance transistor RTR may be turned on or off in response to a control signal applied through the control signal line CTRL. The resistance transistor RTR may have the highest resistance in a turned-off state.

In the transparent display panel 110 according to another embodiment of the present disclosure, the resistance transistor RTR may be turned off after being turned on and then initialized. In the transparent display panel 110 according to another embodiment of the present disclosure, when the resistance transistor RTR is turned off, the voltage of each of the plurality of touch sensors TS may be sensed through the sensing line SSL.

The transparent display panel 110 shown in FIGS. 3 to 9 is described that the sensing transistor SSTR is connected to the touch sensor electrode TSE through the first touch contact electrode TCT1 and the resistance sensor RS is connected to the touch sensor electrode TSE through the second touch contact electrode TCT2, but is not limited thereto. In another embodiment, the sensing transistor SSTR and the resistance sensor RS may be connected to the touch sensor electrode TSE through the same touch contact electrode.

Figure 14:
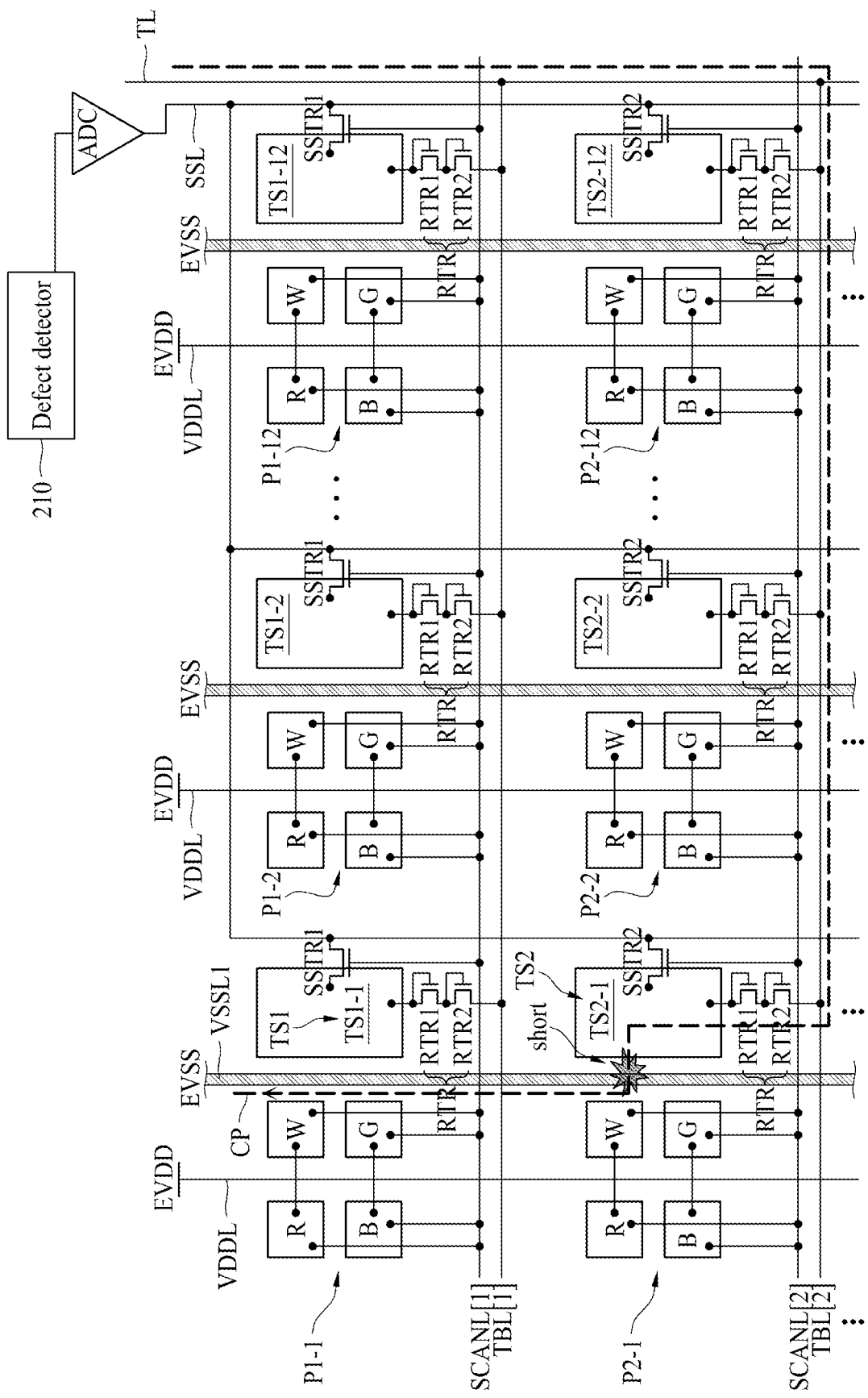
FIG. 14 is a view illustrating a modified embodiment of FIG. 13.

The transparent display panel 110 shown in FIG. 3 includes a separate control signal line CTRL for turning on or off the resistance transistor RTR, but is not limited thereto. FIG. 14 is a view illustrating a modified embodiment of FIG. 13.

Referring to FIG. 14, the transparent display panel 110 according to another embodiment of the present disclosure may include two resistance transistors RTR1 and RTR2 between the touch bridge line TBL and the touch sensor TS. A first electrode of the first resistance transistor RTR1, for example, a drain electrode, may be connected to the touch sensor electrode TSE of the touch sensor TS, and a second electrode thereof, for example, a source electrode, may be connected to the second resistance transistor RTR2. Further, a gate electrode of the first resistance transistor RTR1 may be connected to the first electrode. A first electrode of the second resistance transistor RTR2, for example, a drain electrode, may be connected to the first resistance transistor RTR1, and a second electrode thereof, for example, a source electrode, may be connected to the touch bridge line TBL.

Further, a gate electrode of the second resistance transistor RTR2 may be connected to the first electrode.

The gate electrodes of the first and second resistance transistors RTR1 and RTR2 may be connected to the source electrode or the drain electrode to have high resistance without a separate control signal line CTRL in a turned-off state. Since the transparent display panel 110 that includes the first and second resistance transistors RTR1 and RTR2 as shown in FIG. 14 does not have to include a separate control signal line CTRL, the transmissive area TA may be widened to improve light transmittance as compared with the transparent display panel 110 that includes the resistance transistor RTR as shown in FIG. 13. Alternatively, the transparent display panel 110 that includes the first and second resistance transistors RTR1 and RTR2 as shown in FIG. 14 may increase the spaced distance between the signal lines, particularly the touch lines TL, thereby reducing parasitic capacitance of the touch lines TL.

Figure 15:
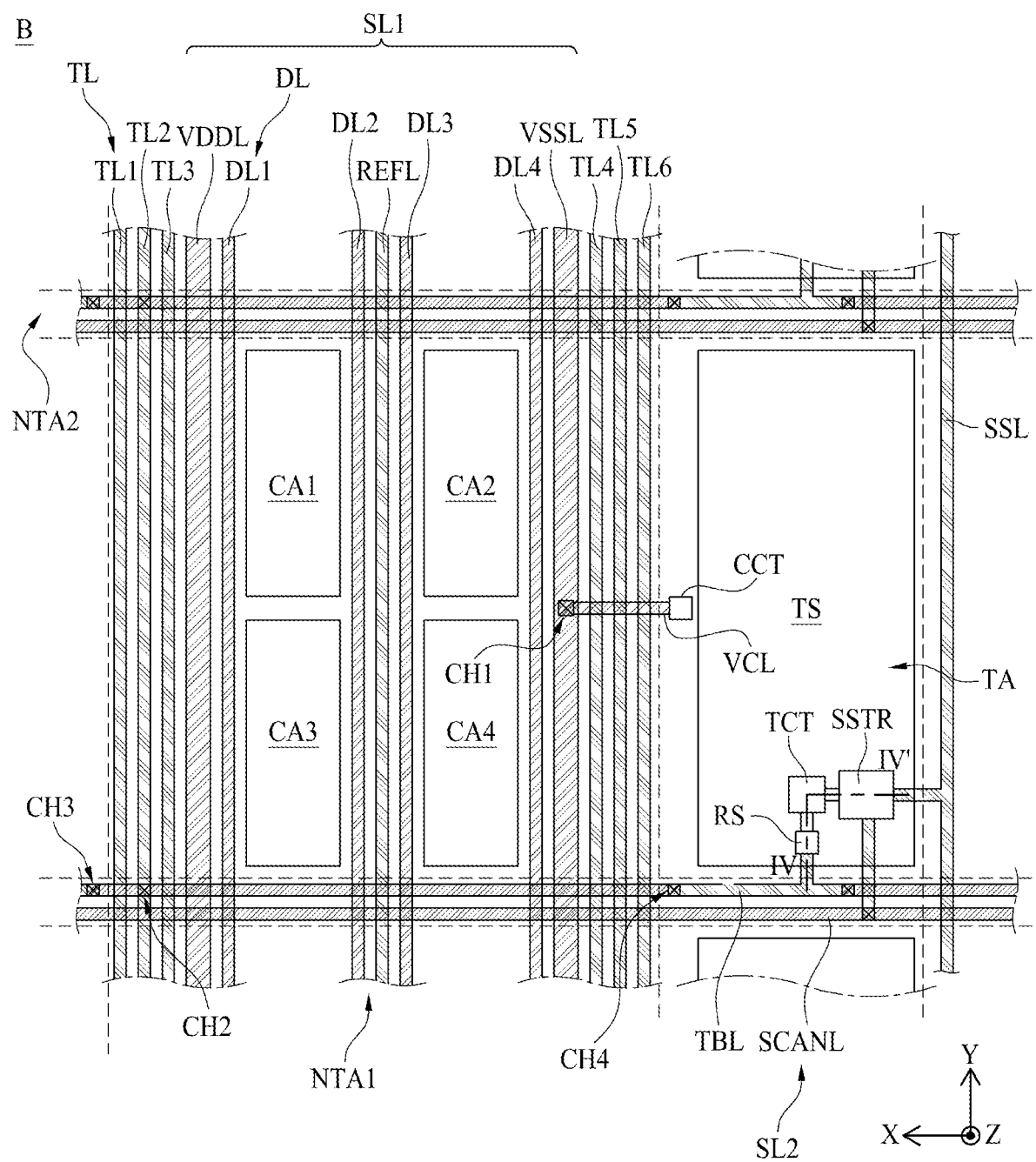
FIG. 15 is a view illustrating a modified embodiment of FIG. 3.
Figure 16:
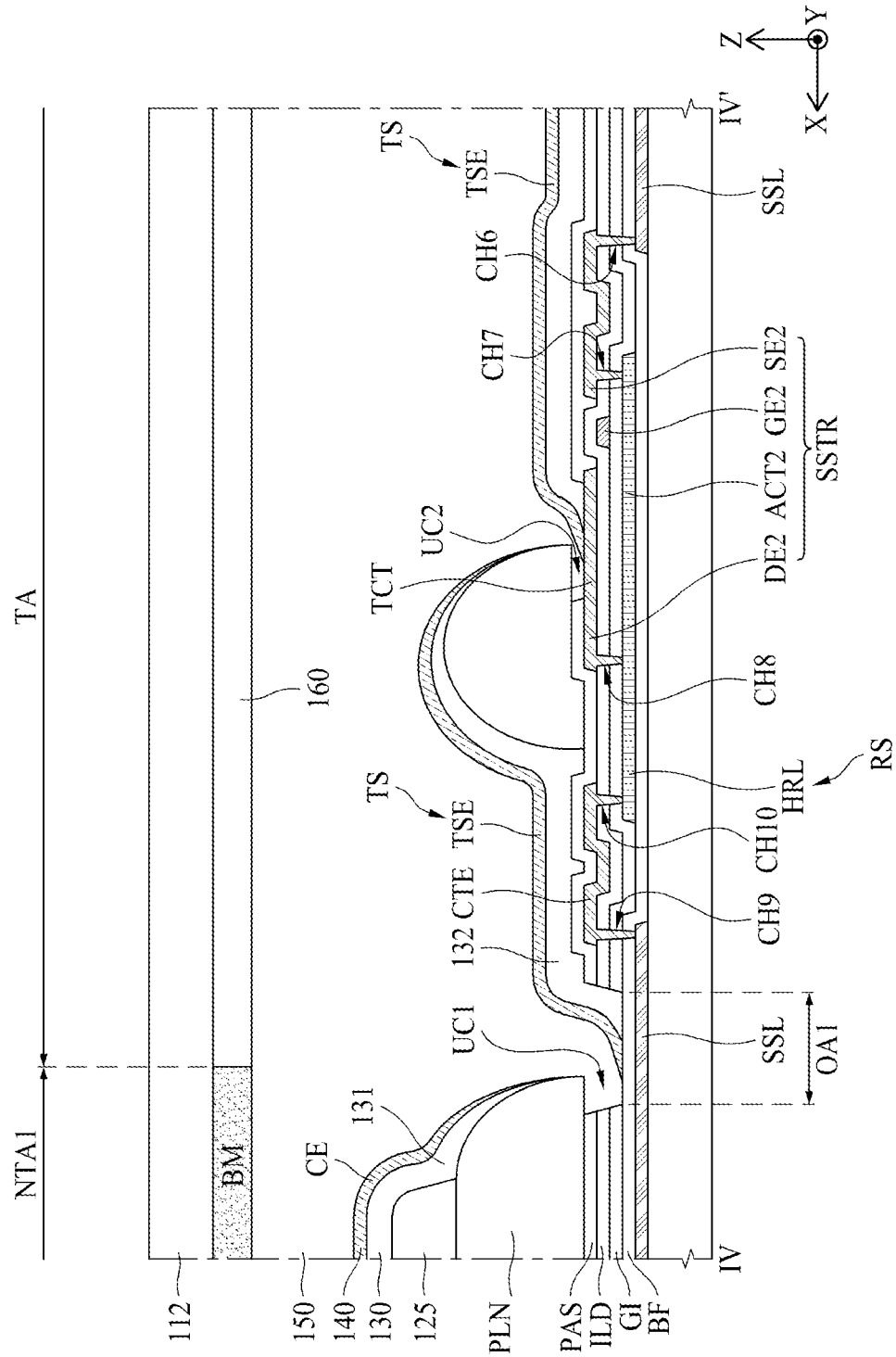
FIG. 16 is a cross-sectional view taken along line IV-IV' of FIG. 15.

FIG. 15 is a view illustrating a modified embodiment of FIG. 3, and FIG. 16 is a cross-sectional view taken along line IV-IV' of FIG. 15.

Referring to FIGS. 15 and 16, in the transparent display panel 110 according to another embodiment of the present disclosure, the sensing transistor SSTR and the resistance sensor RS may be connected to the touch sensor electrode TSE through the same touch contact electrode TCT.

In detail, the resistance sensor RS may include a high resistance line HRL. The high resistance line HRL may be connected to the connection electrode CTE at one end through a tenth contact hole CH10, and may be in contact with the active layer ACT2 of the sensing transistor SSTR at the other end. At this time, the high resistance line HRL of the resistance sensor RS and the active layer ACT2 of the sensing transistor SSTR are formed in a single body so that a portion of the resistance sensor RS may be the high resistance line HRL of the resistance sensor RS, and the other portion of the resistance sensor RS may be the active layer ACT2 of the sensing transistor SSTR.

The sensing transistor SSTR may include an active layer ACT2, a gate electrode GE2, a source electrode SE2 and a drain electrode DE2. The active layer ACT2 of the sensing transistor SSTR may be connected to the source electrode SE2 at one end through the seventh contact hole CH7, and may be connected to the drain electrode DE2 at the other end through the eighth contact hole CH8. The active layer ACT2 of the sensing transistor SSTR may be in contact with the high resistance line HRL of the resistance sensor RS at the other end.

The source electrode SE2 of the sensing transistor SSTR may be connected to the sensing line SSL at one end through the sixth contact hole CH6, and may be connected to the active layer ACT2 at the other end through the seventh contact hole CH7. The drain electrode DE2 of the sensing transistor SSTR may be connected to the active layer ACT2 at one end through the eighth contact hole CH8, and may be in contact with the touch contact electrode TCT at the other end. The drain electrode DE2 of the sensing transistor SSTR and the touch contact electrode TCT may be formed in a single body.

The sensing transistor SSTR may be connected to the touch sensor electrode TSE through the drain electrode DE2 and the touch contact electrode TCT. In addition, the resistance sensor RS may be connected to the touch sensor electrode TSE through the active layer ACT2 and the drain electrode DE2 of the sensing transistor SSTR and the touch contact electrode TCT.

In the transparent display panel 110 according to another embodiment of the present disclosure, the sensing transistor SSTR and the resistance sensor RS may be connected to the touch sensor electrode TSE through one touch contact electrode TCT, whereby the number of touch contact electrodes TCT provided in one touch sensor TS may be reduced. Therefore, in the transparent display panel 110 according to another embodiment of the present disclosure, since an area of an electrode pattern provided in the transmissive area TA is reduced, light transmittance may be improved in the transmissive area TA.

Figure 17:
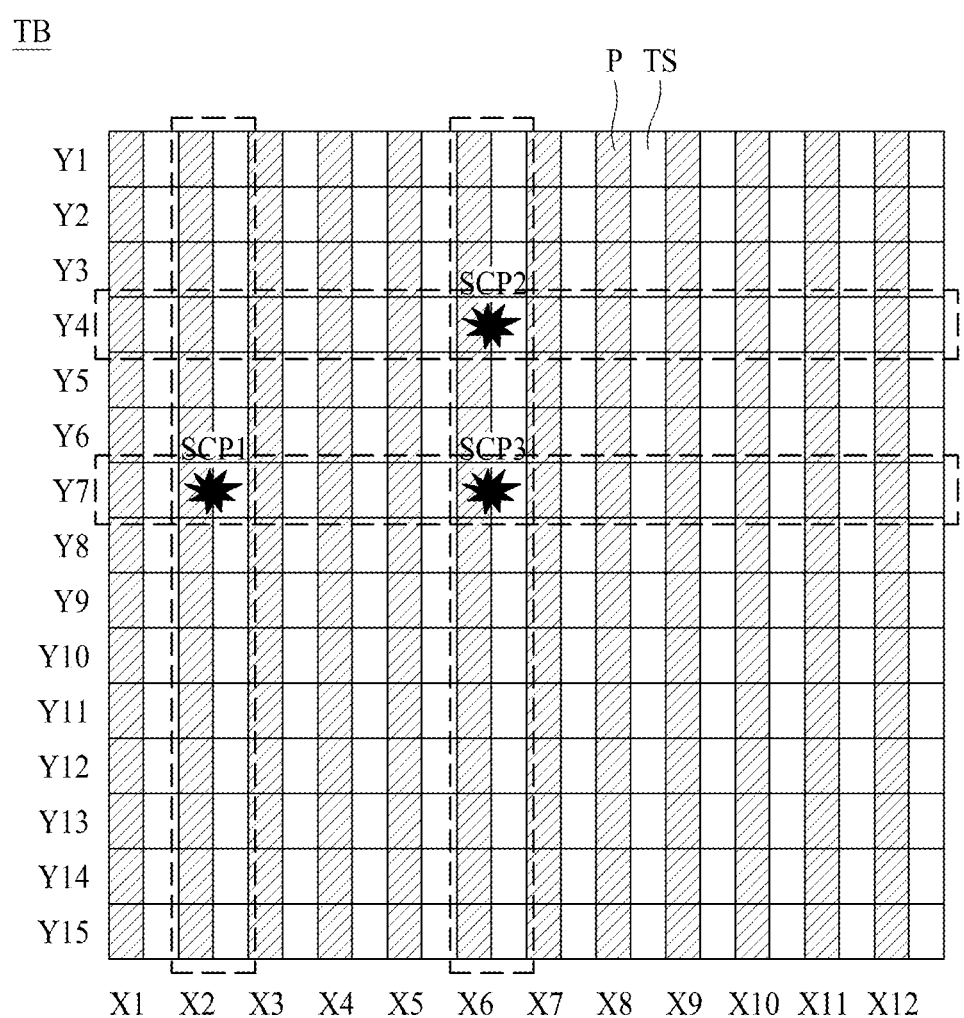
FIG. 17 is a view illustrating an example that a defective touch sensor occurs in one touch block.
Figure 18A:
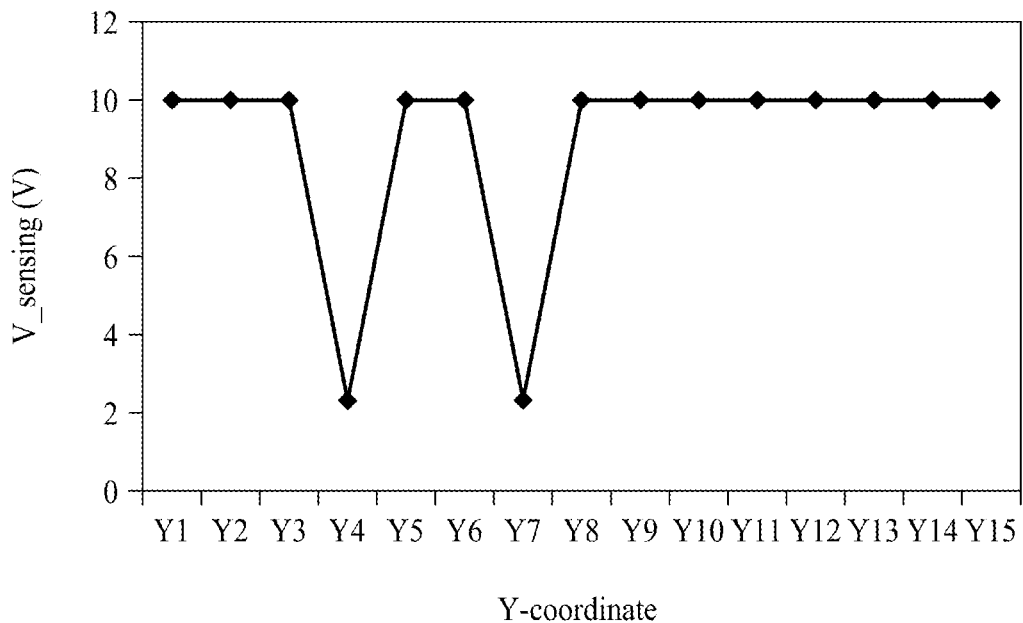
FIGS. 18A and 18B are graphs illustrating voltages of a plurality of touch sensors provided in the touch block of FIG. 17.
Figure 18B:
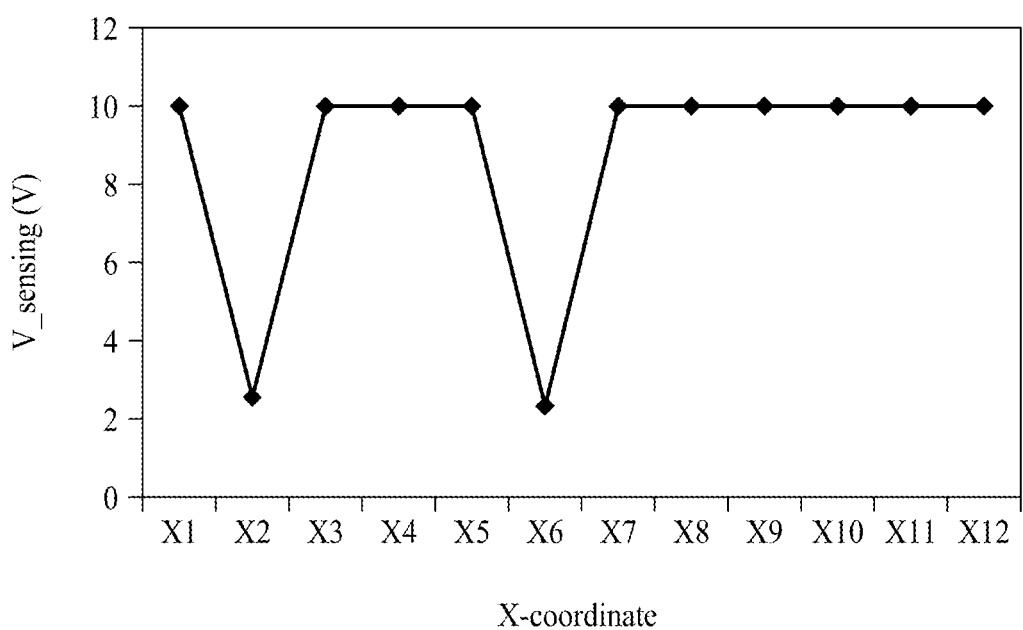

FIG. 17 is a view illustrating an example that a defective touch sensor occurs in one touch block, and FIGS. 18A and 18B are graphs illustrating voltages of a plurality of touch sensors provided in the touch block of FIG. 17.

In the transparent display panel 110 according to embodiments of the present disclosure, the defective touch sensor TS may be detected in the touch block TB through the touch line TL. Each touch block TB may include a plurality of touch sensors TS comprised of M number of rows and N number of columns and a plurality of sensing lines SSL disposed to correspond to the N number of columns (wherein M and N are natural numbers greater than 1). Each of the plurality of sensing lines SSL may be extended in the first direction (e.g., Y-axis direction) and connected to M number of touch sensors TS. Each touch block TB may further include a sensing transistor SSTR connecting the touch sensor TS with the sensing line SSL and a touch connection portion TC connecting the touch sensor TS with the touch line TBL and including a high resistance area, with respect to each of the plurality of touch sensors TS.

In the transparent display panel 110 according to the embodiments of the present disclosure, a first voltage, for example, 20V, may be applied to the touch line TL, and a second voltage, e.g., 0V, may be applied to the common power line VSSL. Also, in the transparent display panel 110 according to embodiments of the present disclosure, a voltage of each of the plurality of touch sensors TS may be sensed through the plurality of sensing lines SSL disposed in the touch block TB.

For example, the touch block TB may include three short-circuit points SCP1, SCP2 and SCP3 as shown in FIG. 17. In the transparent display panel 110 of the present disclosure, the voltages of the touch sensors TS, which are sensed through the sensing line SSL of a sixth line X6, may appear as shown in FIG. 18A. Referring to FIG. 18A, the voltage of the touch sensor TS of a fourth line Y4 and the voltage of the touch sensor TS of a seventh line Y7 may be lower than those of the other touch sensors TS. In this case, the touch sensors of the fourth line Y4 and the seventh line Y7 among the touch sensors TS connected to the sensing line SSL of the sixth line X6 may be the defective touch sensors.

Meanwhile, in the transparent display panel 110 according to the embodiments of the present disclosure, when the scan signal is applied to the scan line SCANL of the seventh line Y7, the voltages of the touch sensors TS, which are respectively sensed through the plurality of sensing lines SSL, may be represented as shown in FIG. 18B. Referring to FIG. 18B, the voltage of the touch sensor TS of a second line X2 and the voltage of the touch sensor TS of a sixth line X6 may be lower than those of the other touch sensors TS. In this case, the touch sensors of the second line X2 and the sixth line X6 among the touch sensors TS disposed in a line along the scan line SCANL of the seventh line Y7 may be the defective touch sensors.

In the transparent display panel 110 according to the embodiments of the present disclosure, the touch connection line TCL connected to the defective touch sensors TS may be cut by a laser, whereby the defective touch sensor TS and the touch bridge line TCL may be electrically separated from each other. Therefore, the transparent display panel 110 according to another embodiment of the present disclosure may allow the other touch sensors TS of the corresponding touch block TB to operate normally.

In the transparent display panel 110 according to the embodiments of the present disclosure, the defective touch sensor TS may be exactly detected in one touch block TB in a unit of pixel. Therefore, the transparent display panel 110 according to the embodiments of the present disclosure may reduce a touch defect rate and improve a touch recognition rate.

Also, in the transparent display panel 110 according to the embodiments of the present disclosure does not have to detect a touch block, in which the defective touch sensor TS is included, among a plurality of touch blocks TB. That is, the transparent display panel 110 according to the embodiments of the present disclosure does not require inspection in a unit of a touch block, may sense the voltage of each of the plurality of touch sensors TS through the plurality of sensing lines SSL at a time, and may detect a defective touch sensor TS based on the voltage of each of the plurality of sensed touch sensors TS. Therefore, the transparent display panel 110 according to the embodiments of the present disclosure may shorten the inspection time.

In addition, in the transparent display panel 110, since the voltages of the plurality of touch sensors TS are sensed through separate sensing lines SSL, the transparent display panel 110 may not affect display driving.

According to the present disclosure, the following advantageous effects may be obtained. In the present disclosure, the touch sensor electrode of the touch sensor and the cathode electrode of the light emitting element may be formed using the undercut structure, so that the touch process may be simplified, and a separate mask for the touch sensor electrode is not additionally required.

Also, in the present disclosure, the defective touch sensor may be exactly detected in one touch block. Therefore, in the present disclosure, a touch defect rate may be reduced, and a touch recognition rate may be improved.

Also, in the present disclosure, inspection in a unit of a touch block may not be required, the voltage of each of the plurality of touch sensors may be sensed through the plurality of sensing lines at a time, and the defective touch sensor may be detected based on the sensed voltage. Therefore, in the present disclosure, the time for inspecting the defective touch sensor may be shortened.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is intended to cover all variations or modifications derived from the meaning, scope and equivalent concept described in the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device with a touch sensor, the transparent display device comprising:
   a plurality of transmissive areas and a non-transmissive area disposed between the transmissive areas adjacent to each other;
   a plurality of touch lines provided in the non-transmissive area; and
   a plurality of touch blocks respectively connected to the plurality of touch lines,
   wherein each of the plurality of touch blocks includes:
      a plurality of touch sensors disposed in the plurality of transmissive areas and comprised of M number of rows and N number of columns, M and N are natural numbers greater than 1;
      a plurality of sensing lines disposed to correspond to the N number of columns; and
      a plurality of sensing transistors respectively connected to the plurality of touch sensors, transferring a voltage of the connected touch sensor to one of the plurality of sensing lines,
   wherein each of the plurality of touch blocks further includes a plurality of touch connection portions electrically connecting each of the plurality of touch sensors to the touch line, including a high resistance area.

2. The transparent display device of claim 1, further comprising a plurality of pixels provided in the non-transmissive area, including a plurality of subpixels,
   wherein the plurality of touch sensors correspond to the plurality of pixels one-to-one.

3. The transparent display device of claim 2, wherein each of the plurality of subpixels includes a light emitting element comprised of an anode electrode, a light emitting layer and a cathode electrode, and each of the plurality of touch sensors includes a touch sensor electrode, and
   wherein the cathode electrode constituting the light emitting element and the touch sensor electrode constituting the touch sensor are provided in a same layer.

4. The transparent display device of claim 3, further comprising a first undercut structure provided in the transmissive area, having a planar closed shape,
   wherein the cathode electrode and the touch sensor electrode are separated from each other by the first undercut structure.

5. The transparent display device of claim 2, wherein the touch line is electrically connected to the touch sensor electrode, and
   wherein the transparent display device further includes:
      a common power line provided in the non-transmissive area and electrically connected to the cathode electrode;
      a plurality of scan lines provided in the non-transmissive area, supplying a scan signal to the plurality of pixels or the plurality of sensing transistors; and
      a defect detection circuit controlling a first voltage and a second voltage to be applied to the common power line and the touch line, respectively, sensing the voltage of each of the plurality of touch sensors through the plurality of sensing lines and detecting a defective touch sensor among the plurality of touch sensors based on the sensed voltage.

6. The transparent display device of claim 1, wherein each of the plurality of touch connection portions includes a resistance transistor provided with an active layer, a gate electrode, a source electrode, and a drain electrode in the high resistance area.

7. The transparent display device of claim 6, wherein the resistance transistor includes a first resistance transistor electrically connected to a touch sensor electrode of the touch sensor and a second resistance transistor electrically connected to the first resistance transistor and one of the plurality of touch lines, and
wherein a gate electrode of each of the first resistance transistor and the second resistance transistor is electrically connected to a source electrode or a drain electrode.

8. The transparent display device of claim 1, wherein each of the plurality of sensing lines is electrically connected to M number of touch sensors extended in a first direction and disposed in a line in the first direction.

9. The transparent display device of claim 1, further comprising a plurality of scan lines supplying a scan signal to each of the plurality of sensing transistors,
wherein each of the plurality of sensing transistors is electrically connected to one of the plurality of touch sensors and one of the plurality of sensing lines, and transfers the voltage of the connected touch sensor to the connected sensing line when each of the plurality of sensing transistors is turned on in response to the scan signal.

10. The transparent display device of claim 1, wherein the plurality of sensing lines individually sense the voltages of the plurality of touch sensors.

11. The transparent display device of claim 1, wherein each of the plurality of sensing transistors at least partially overlaps the connected touch sensor.

12. The transparent display device of claim 1, wherein the high resistance area at least partially overlaps the touch sensor.

13. The transparent display device of claim 1, wherein each of the plurality of touch connection portions includes a resistance sensor that includes a high resistance line made of a silicon-based semiconductor material or an oxide-based semiconductor material in the high resistance area.

14. The transparent display device of claim 1, wherein each of the plurality of sensing lines is disposed between the plurality of touch lines and the transmissive area.

15. A transparent display device with a touch sensor, the transparent display device comprising:
a plurality of transmissive areas and a non-transmissive area disposed between the transmissive areas adjacent to each other;
a plurality of touch lines provided in the non-transmissive area;
a plurality of touch blocks respectively connected to the plurality of touch lines;
a plurality of pixels provided in the non-transmissive area, including a plurality of subpixels; and
a first undercut structure provided in the transmissive area,
wherein each of the plurality of touch blocks includes:
a plurality of touch sensors disposed in the plurality of transmissive areas and comprised of M number of rows and N number of columns, M and N are natural numbers greater than 1;
a plurality of sensing lines disposed to correspond to the N number of columns; and
a plurality of sensing transistors respectively connected to the plurality of touch sensors, transferring a voltage of the connected touch sensor to one of the plurality of sensing lines,
wherein the plurality of touch sensors corresponds to the plurality of pixels one-to-one,
wherein each of the plurality of subpixels includes a light emitting element comprised of an anode electrode, a light emitting layer and a cathode electrode, and each of the plurality of touch sensors includes a touch sensor electrode,
wherein the cathode electrode constituting the light emitting element and the touch sensor electrode constituting the touch sensor are provided in a same layer, and
wherein the cathode electrode and the touch sensor electrode are separated from each other by the first undercut structure.

16. The transparent display device of claim 15, wherein the touch line is electrically connected to the touch sensor electrode, and
wherein the transparent display device further includes:
a common power line provided in the non-transmissive area and electrically connected to the cathode electrode;
a plurality of scan lines provided in the non-transmissive area, supplying a scan signal to the plurality of pixels or the plurality of sensing transistors; and
a defect detection circuit controlling a first voltage and a second voltage to be applied to the common power line and the touch line, respectively, sensing the voltage of each of the plurality of touch sensors through the plurality of sensing lines and detecting a defective touch sensor among the plurality of touch sensors based on the sensed voltage.

17. The transparent display device of claim 15, wherein the plurality of sensing lines individually senses the voltages of the plurality of touch sensors.

18. The transparent display device of claim 15, wherein each of the plurality of sensing transistors at least partially overlaps the connected touch sensor.

19. A transparent display device with a touch sensor, the transparent display device comprising:
a plurality of transmissive areas and a non-transmissive area disposed between the transmissive areas adjacent to each other;
a plurality of touch lines provided in the non-transmissive area;
a plurality of touch blocks respectively connected to the plurality of touch lines; and
a plurality of pixels provided in the non-transmissive area, including a plurality of subpixels,
wherein each of the plurality of touch blocks includes:
a plurality of touch sensors disposed in the plurality of transmissive areas and comprised of M number of rows and N number of columns, M and N are natural numbers greater than 1;
a plurality of sensing lines disposed to correspond to the N number of columns; and a plurality of sensing transistors respectively connected to the plurality of touch sensors, transferring a voltage of the connected touch sensor to one of the plurality of sensing lines, wherein the plurality of touch sensors corresponds to the plurality of pixels one-to-one, wherein the touch line is electrically connected to the touch sensor electrode, and wherein the transparent display device further includes:
- a common power line provided in the non-transmissive area and electrically connected to the cathode electrode;
- a plurality of scan lines provided in the non-transmissive area, supplying a scan signal to the plurality of pixels or the plurality of sensing transistors; and
- a defect detection circuit controlling a first voltage and a second voltage to be applied to the common power line and the touch line, respectively, sensing the voltage of each of the plurality of touch sensors through the plurality of sensing lines and detecting a defective touch sensor among the plurality of touch sensors based on the sensed voltage.

* * * * *